(12) United States Patent
Merrow

(10) Patent No.: US 7,929,303 B1
(45) Date of Patent: Apr. 19, 2011

(54) STORAGE DEVICE TESTING SYSTEM COOLING

(75) Inventor: Brian S. Merrow, Harvard, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 12/775,560

(22) Filed: May 7, 2010

Related U.S. Application Data

(63) Continuation of application No. 12/698,575, filed on Feb. 2, 2010.

(51) Int. Cl.
*H05K 7/20* (2006.01)
(52) U.S. Cl. .............. 361/695; 361/679.48; 361/679.49; 361/679.33; 361/727; 324/73.1; 324/158.1; 454/184; 360/97.02; 73/856.6
(58) Field of Classification Search ............. 361/679.31, 361/679.33, 679.48, 679.49, 679.5, 690–697, 361/717–727; 324/73.1, 158.1, 212; 165/104.33, 165/121–126, 185, 104.34; 360/97.02, 92.1, 360/31, 71; 454/184; 73/862.541, 865.6
See application file for complete search history.

(56) References Cited

U.S. PATENT DOCUMENTS

| | | | |
|---|---|---|---|
| 557,186 | A | 3/1896 | Cahill |
| 2,224,407 | A | 12/1940 | Passur |
| 2,380,026 | A | 7/1945 | Clarke |
| 2,631,775 | A | 3/1953 | Gordon |
| 2,635,524 | A | 4/1953 | Jenkins |
| 3,120,166 | A | 2/1964 | Lyman |
| 3,360,032 | A | 12/1967 | Sherwood |
| 3,364,838 | A | 1/1968 | Bradley |
| 3,517,601 | A | 6/1970 | Courchesne |
| 3,845,286 | A | 10/1974 | Aronstein et al. |
| 4,147,299 | A | 4/1979 | Freeman |
| 4,233,644 | A | 11/1980 | Hwang et al. |
| 4,336,748 | A | 6/1982 | Martin et al. |
| 4,379,259 | A | 4/1983 | Varadi et al. |
| 4,477,127 | A | 10/1984 | Kume |
| 4,495,545 | A | 1/1985 | Dufresne et al. |
| 4,526,318 | A | 7/1985 | Fleming et al. |

(Continued)

FOREIGN PATENT DOCUMENTS

AU 583716 5/1989

(Continued)

OTHER PUBLICATIONS

Cardinal Intellectual Property's search report including the results of a search for the features of the claims included in the U.S. patent application entitled "Storage Device Testing System Cooling", inventors: Brian S. Merrow. The foregoing U.S. patent application is a continuation of U.S. Appl. No. 12/698,575.

(Continued)

*Primary Examiner* — Michael V Datskovskiy
(74) *Attorney, Agent, or Firm* — Fish & Richardson P.C.

(57) ABSTRACT

A storage device testing system that includes at least one rack, test slots housed by each rack, and at least one air mover in pneumatic communication with the test slots. Each test slot includes a test slot housing having an entrance and an exit, with the entrance configured to receive a storage device. The at least one air mover is configured to move air exterior to the racks into the entrance of each test slot housing, over the received storage device, and out of the exit of each test slot housing.

5 Claims, 14 Drawing Sheets

U.S. PATENT DOCUMENTS

| | | | |
|---|---|---|---|
| 4,620,248 A | 10/1986 | Gitzendanner | |
| 4,648,007 A | 3/1987 | Garner | |
| 4,654,732 A | 3/1987 | Mesher | |
| 4,665,455 A | 5/1987 | Mesher | |
| 4,683,424 A | 7/1987 | Cutright et al. | |
| 4,685,303 A | 8/1987 | Branc et al. | |
| 4,688,124 A | 8/1987 | Scribner et al. | |
| 4,713,714 A | 12/1987 | Gatti et al. | |
| 4,739,444 A | 4/1988 | Zushi et al. | |
| 4,754,397 A | 6/1988 | Varaiya et al. | |
| 4,768,285 A | 9/1988 | Woodman, Jr. | |
| 4,778,063 A | 10/1988 | Ueberreiter | |
| 4,801,234 A | 1/1989 | Cedrone | |
| 4,809,881 A | 3/1989 | Becker | |
| 4,817,273 A | 4/1989 | Lape et al. | |
| 4,817,934 A | 4/1989 | McCormick et al. | |
| 4,851,965 A | 7/1989 | Gabuzda et al. | |
| 4,881,591 A | 11/1989 | Rignall | |
| 4,888,549 A * | 12/1989 | Wilson et al. | 324/73.1 |
| 4,911,281 A | 3/1990 | Jenkner | |
| 4,967,155 A | 10/1990 | Magnuson | |
| 5,012,187 A | 4/1991 | Littlebury | |
| 5,045,960 A | 9/1991 | Eding | |
| 5,061,630 A | 10/1991 | Knopf et al. | |
| 5,119,270 A | 6/1992 | Bolton et al. | |
| 5,122,914 A | 6/1992 | Hanson | |
| 5,127,684 A | 7/1992 | Klotz et al. | |
| 5,128,813 A | 7/1992 | Lee | |
| 5,136,395 A | 8/1992 | Ishii et al. | |
| 5,158,132 A | 10/1992 | Guillemot | |
| 5,168,424 A | 12/1992 | Bolton et al. | |
| 5,171,183 A | 12/1992 | Pollard et al. | |
| 5,173,819 A | 12/1992 | Takahashi et al. | |
| 5,176,202 A | 1/1993 | Richard | |
| 5,205,132 A | 4/1993 | Fu | |
| 5,206,772 A | 4/1993 | Hirano et al. | |
| 5,207,613 A | 5/1993 | Ferchau et al. | |
| 5,210,680 A | 5/1993 | Scheibler | |
| 5,237,484 A | 8/1993 | Ferchau et al. | |
| 5,263,537 A | 11/1993 | Plucinski et al. | |
| 5,269,698 A | 12/1993 | Singer | |
| 5,295,392 A | 3/1994 | Hensel et al. | |
| 5,309,323 A | 5/1994 | Gray et al. | |
| 5,325,263 A | 6/1994 | Singer et al. | |
| 5,349,486 A | 9/1994 | Sugimoto et al. | |
| 5,368,072 A | 11/1994 | Cote | |
| 5,374,395 A | 12/1994 | Robinson et al. | |
| 5,379,229 A | 1/1995 | Parsons et al. | |
| 5,398,058 A | 3/1995 | Hattori | |
| 5,412,534 A | 5/1995 | Cutts et al. | |
| 5,414,591 A | 5/1995 | Kimura et al. | |
| 5,426,581 A | 6/1995 | Kishi et al. | |
| 5,469,037 A | 11/1995 | McMurtrey, Sr. et al. | |
| 5,477,416 A | 12/1995 | Schkrohowsky et al. | |
| 5,484,012 A | 1/1996 | Hiratsuka | |
| 5,486,681 A | 1/1996 | Dagnac et al. | |
| 5,491,610 A | 2/1996 | Mok et al. | |
| 5,543,727 A | 8/1996 | Bushard et al. | |
| 5,546,250 A | 8/1996 | Diel | |
| 5,557,186 A | 9/1996 | McMurtrey, Sr. et al. | |
| 5,563,768 A | 10/1996 | Perdue | |
| 5,570,740 A | 11/1996 | Flores et al. | |
| 5,593,380 A | 1/1997 | Bittikofer | |
| 5,601,141 A | 2/1997 | Gordon et al. | |
| 5,604,662 A | 2/1997 | Anderson et al. | |
| 5,610,893 A | 3/1997 | Soga et al. | |
| 5,617,430 A | 4/1997 | Angelotti et al. | |
| 5,644,705 A | 7/1997 | Stanley | |
| 5,646,918 A | 7/1997 | Dimitri et al. | |
| 5,654,846 A | 8/1997 | Wicks et al. | |
| 5,673,029 A | 9/1997 | Behl et al. | |
| 5,694,290 A | 12/1997 | Chang | |
| 5,718,627 A | 2/1998 | Wicks | |
| 5,718,628 A | 2/1998 | Nakazato et al. | |
| 5,731,928 A | 3/1998 | Jabbari et al. | |
| 5,751,549 A | 5/1998 | Eberhardt et al. | |
| 5,754,365 A | 5/1998 | Beck et al. | |
| 5,761,032 A | 6/1998 | Jones | |
| 5,793,610 A | 8/1998 | Schmitt et al. | |
| 5,811,678 A | 9/1998 | Hirano | |
| 5,812,761 A | 9/1998 | Seki et al. | |
| 5,819,842 A | 10/1998 | Potter et al. | |
| 5,831,525 A | 11/1998 | Harvey | |
| 5,851,143 A | 12/1998 | Hamid | |
| 5,859,409 A | 1/1999 | Kim et al. | |
| 5,859,540 A | 1/1999 | Fukumoto | |
| 5,862,037 A | 1/1999 | Behl | |
| 5,870,630 A | 2/1999 | Reasoner et al. | |
| 5,886,639 A | 3/1999 | Behl et al. | |
| 5,890,959 A | 4/1999 | Pettit et al. | |
| 5,912,799 A | 6/1999 | Grouell et al. | |
| 5,913,926 A | 6/1999 | Anderson et al. | |
| 5,914,856 A | 6/1999 | Morton et al. | |
| 5,927,386 A | 7/1999 | Lin | |
| 5,956,301 A | 9/1999 | Dimitri et al. | |
| 5,959,834 A | 9/1999 | Chang | |
| 5,999,356 A | 12/1999 | Dimitri et al. | |
| 5,999,365 A | 12/1999 | Hasegawa et al. | |
| 6,000,623 A | 12/1999 | Blatti et al. | |
| 6,005,404 A | 12/1999 | Cochran et al. | |
| 6,005,770 A | 12/1999 | Schmitt | |
| 6,008,636 A | 12/1999 | Miller et al. | |
| 6,008,984 A | 12/1999 | Cunningham et al. | |
| 6,011,689 A | 1/2000 | Wrycraft | |
| 6,031,717 A | 2/2000 | Baddour et al. | |
| 6,034,870 A | 3/2000 | Osborn et al. | |
| 6,042,348 A | 3/2000 | Aakalu et al. | |
| 6,045,113 A | 4/2000 | Itakura | |
| 6,055,814 A | 5/2000 | Song | |
| 6,066,822 A | 5/2000 | Nemoto et al. | |
| 6,067,225 A | 5/2000 | Reznikov et al. | |
| 6,069,792 A | 5/2000 | Nelik | |
| 6,084,768 A | 7/2000 | Bologna | |
| 6,094,342 A | 7/2000 | Dague et al. | |
| 6,104,607 A | 8/2000 | Behl | |
| 6,115,250 A | 9/2000 | Schmitt | |
| 6,122,131 A | 9/2000 | Jeppson | |
| 6,122,232 A | 9/2000 | Schell et al. | |
| 6,124,707 A | 9/2000 | Kim et al. | |
| 6,130,817 A | 10/2000 | Flotho et al. | |
| 6,144,553 A | 11/2000 | Hileman et al. | |
| 6,166,901 A | 12/2000 | Gamble et al. | |
| 6,169,413 B1 | 1/2001 | Paek et al. | |
| 6,169,930 B1 | 1/2001 | Blachek et al. | |
| 6,177,805 B1 | 1/2001 | Pih | |
| 6,178,835 B1 | 1/2001 | Orriss et al. | |
| 6,181,557 B1 | 1/2001 | Gatti | |
| 6,185,065 B1 | 2/2001 | Hasegawa et al. | |
| 6,185,097 B1 | 2/2001 | Behl | |
| 6,188,191 B1 | 2/2001 | Frees et al. | |
| 6,192,282 B1 | 2/2001 | Smith et al. | |
| 6,193,339 B1 | 2/2001 | Behl et al. | |
| 6,209,842 B1 | 4/2001 | Anderson et al. | |
| 6,227,516 B1 | 5/2001 | Webster, Jr. et al. | |
| 6,229,275 B1 | 5/2001 | Yamamoto | |
| 6,231,145 B1 | 5/2001 | Liu | |
| 6,233,148 B1 | 5/2001 | Shen | |
| 6,236,563 B1 | 5/2001 | Buican et al. | |
| 6,247,944 B1 | 6/2001 | Bolognia et al. | |
| 6,249,824 B1 | 6/2001 | Henrichs | |
| 6,252,769 B1 | 6/2001 | Tullstedt et al. | |
| 6,262,863 B1 | 7/2001 | Ostwald et al. | |
| 6,272,007 B1 | 8/2001 | Kitlas et al. | |
| 6,272,767 B1 | 8/2001 | Botruff et al. | |
| 6,281,677 B1 | 8/2001 | Cosci et al. | |
| 6,282,501 B1 | 8/2001 | Assouad | |
| 6,285,524 B1 | 9/2001 | Boigenzahn et al. | |
| 6,289,678 B1 | 9/2001 | Pandolfi | |
| 6,297,950 B1 | 10/2001 | Erwin | |
| 6,298,672 B1 | 10/2001 | Valicoff, Jr. | |
| 6,302,714 B1 | 10/2001 | Bolognia et al. | |
| 6,304,839 B1 | 10/2001 | Ho et al. | |
| 6,307,386 B1 | 10/2001 | Fowler et al. | |
| 6,327,150 B1 | 12/2001 | Levy et al. | |
| 6,330,154 B1 | 12/2001 | Fryers et al. | |
| 6,351,379 B1 | 2/2002 | Cheng | |
| 6,354,792 B1 | 3/2002 | Kobayashi et al. | |

| Patent | Date | Name | | Patent | Date | Name |
|---|---|---|---|---|---|---|
| 6,356,409 B1 | 3/2002 | Price et al. | | 7,076,391 B1 | 7/2006 | Pakzad et al. |
| 6,356,415 B1 | 3/2002 | Kabasawa | | 7,077,614 B1 | 7/2006 | Hasper et al. |
| 6,384,995 B1 | 5/2002 | Smith | | 7,088,541 B2 | 8/2006 | Orriss et al. |
| 6,388,437 B1 | 5/2002 | Wolski et al. | | 7,092,251 B1 | 8/2006 | Henry |
| 6,388,875 B1 | 5/2002 | Chen | | 7,106,582 B2 | 9/2006 | Albrecht et al. |
| 6,388,878 B1 | 5/2002 | Chang | | 7,123,477 B2 | 10/2006 | Coglitore et al. |
| 6,389,225 B1 | 5/2002 | Malinoski et al. | | 7,126,777 B2 | 10/2006 | Flechsig et al. |
| 6,411,584 B2 | 6/2002 | Davis et al. | | 7,130,138 B2 | 10/2006 | Lum et al. |
| 6,421,236 B1 | 7/2002 | Montoya et al. | | 7,134,553 B2 | 11/2006 | Stephens |
| 6,434,000 B1 | 8/2002 | Pandolfi | | 7,139,145 B1 | 11/2006 | Archibald et al. |
| 6,434,498 B1 | 8/2002 | Ulrich et al. | | 7,164,579 B1 | 1/2007 | Muncaster et al. |
| 6,434,499 B1 | 8/2002 | Ulrich et al. | | 7,167,360 B2 | 1/2007 | Inoue et al. |
| 6,464,080 B1 | 10/2002 | Morris et al. | | 7,181,458 B1 | 2/2007 | Higashi |
| 6,467,153 B2 | 10/2002 | Butts et al. | | 7,203,021 B1 | 4/2007 | Ryan et al. |
| 6,473,297 B1 | 10/2002 | Behl et al. | | 7,203,060 B2 | 4/2007 | Kay et al. |
| 6,473,301 B1 | 10/2002 | Levy et al. | | 7,206,201 B2 | 4/2007 | Behl et al. |
| 6,476,627 B1 | 11/2002 | Pelissier et al. | | 7,216,968 B2 | 5/2007 | Smith et al. |
| 6,477,044 B2 | 11/2002 | Foley et al. | | 7,219,028 B2 | 5/2007 | Bae et al. |
| 6,477,442 B1 | 11/2002 | Valerino, Sr. | | 7,219,273 B2 | 5/2007 | Fisher et al. |
| 6,480,380 B1 | 11/2002 | French et al. | | 7,227,746 B2 | 6/2007 | Tanaka et al. |
| 6,480,382 B2 | 11/2002 | Cheng | | 7,232,101 B2 | 6/2007 | Wanek et al. |
| 6,487,071 B1 | 11/2002 | Tata et al. | | 7,243,043 B2 | 7/2007 | Shin |
| 6,489,793 B2 | 12/2002 | Jones et al. | | 7,248,467 B2 | 7/2007 | Sri-Jayantha et al. |
| 6,494,663 B2 | 12/2002 | Ostwald et al. | | 7,259,966 B2 | 8/2007 | Connelly, Jr. et al. |
| 6,525,933 B2 | 2/2003 | Eland | | 7,273,344 B2 | 9/2007 | Ostwald et al. |
| 6,526,841 B1 * | 3/2003 | Wanek et al. ............... 73/865.6 | | 7,280,353 B2 | 10/2007 | Wendel et al. |
| 6,535,384 B2 | 3/2003 | Huang | | 7,289,885 B2 | 10/2007 | Basham et al. |
| 6,537,013 B2 | 3/2003 | Emberty et al. | | 7,304,855 B1 | 12/2007 | Milligan et al. |
| 6,544,309 B1 | 4/2003 | Hoefer et al. | | 7,315,447 B2 | 1/2008 | Inoue et al. |
| 6,546,445 B1 | 4/2003 | Hayes | | 7,349,205 B2 | 3/2008 | Hall et al. |
| 6,553,532 B1 | 4/2003 | Aoki | | 7,353,524 B1 | 4/2008 | Lin et al. |
| 6,560,107 B1 | 5/2003 | Beck et al. | | 7,385,385 B2 | 6/2008 | Magliocco et al. |
| 6,565,163 B2 | 5/2003 | Behl et al. | | 7,395,133 B2 | 7/2008 | Lowe |
| 6,566,859 B2 | 5/2003 | Wolski et al. | | 7,403,451 B2 | 7/2008 | Goodman et al. |
| 6,567,266 B2 | 5/2003 | Ives et al. | | 7,437,212 B2 | 10/2008 | Farchmin et al. |
| 6,570,734 B2 | 5/2003 | Ostwald et al. | | 7,447,011 B2 * | 11/2008 | Wade et al. ............... 361/679.33 |
| 6,577,586 B1 | 6/2003 | Yang et al. | | 7,457,112 B2 | 11/2008 | Fukuda et al. |
| 6,577,687 B2 | 6/2003 | Hall et al. | | 7,467,024 B2 | 12/2008 | Flitsch |
| 6,618,254 B2 | 9/2003 | Ives | | 7,476,362 B2 | 1/2009 | Angros |
| 6,626,846 B2 | 9/2003 | Spencer | | 7,483,269 B1 | 1/2009 | Marvin, Jr. et al. |
| 6,628,518 B2 | 9/2003 | Behl et al. | | 7,505,264 B2 | 3/2009 | Hall et al. |
| 6,635,115 B1 | 10/2003 | Fairbairn et al. | | 7,554,811 B2 | 6/2009 | Scicluna et al. |
| 6,640,235 B1 | 10/2003 | Anderson | | 7,568,122 B2 | 7/2009 | Mechalke et al. |
| 6,644,982 B1 | 11/2003 | Ondricek et al. | | 7,570,455 B2 | 8/2009 | Deguchi et al. |
| 6,651,192 B1 | 11/2003 | Viglione et al. | | 7,573,715 B2 | 8/2009 | Mojaver et al. |
| 6,654,240 B1 | 11/2003 | Tseng et al. | | 7,584,851 B2 | 9/2009 | Hong et al. |
| 6,679,128 B2 | 1/2004 | Wanek et al. | | 7,612,996 B2 | 11/2009 | Atkins et al. |
| 6,693,757 B2 | 2/2004 | Hayakawa et al. | | 7,625,027 B2 | 12/2009 | Kiaie et al. |
| 6,741,529 B1 | 5/2004 | Getreuer | | 7,630,196 B2 | 12/2009 | Hall et al. |
| 6,746,648 B1 | 6/2004 | Mattila et al. | | 7,643,289 B2 | 1/2010 | Ye et al. |
| 6,751,093 B1 | 6/2004 | Hsu et al. | | 7,646,596 B2 | 1/2010 | Ng |
| 6,791,785 B1 | 9/2004 | Messenger et al. | | 7,729,107 B2 * | 6/2010 | Atkins et al. ............... 361/679.02 |
| 6,791,799 B2 | 9/2004 | Fletcher | | 2001/0006453 A1 | 7/2001 | Glorioso et al. |
| 6,798,651 B2 | 9/2004 | Syring et al. | | 2001/0044023 A1 | 11/2001 | Johnson et al. |
| 6,798,972 B1 | 9/2004 | Ito et al. | | 2001/0046118 A1 | 11/2001 | Yamanashi et al. |
| 6,801,834 B1 | 10/2004 | Konshak et al. | | 2001/0048590 A1 | 12/2001 | Behl et al. |
| 6,806,700 B2 | 10/2004 | Wanek et al. | | 2002/0030981 A1 | 3/2002 | Sullivan et al. |
| 6,811,427 B2 | 11/2004 | Garrett et al. | | 2002/0044416 A1 | 4/2002 | Harmon, III et al. |
| 6,826,046 B1 | 11/2004 | Muncaster et al. | | 2002/0051338 A1 | 5/2002 | Jiang et al. |
| 6,830,372 B2 | 12/2004 | Liu et al. | | 2002/0071248 A1 | 6/2002 | Huang et al. |
| 6,832,929 B2 | 12/2004 | Garrett et al. | | 2002/0079422 A1 | 6/2002 | Jiang |
| 6,861,861 B2 | 3/2005 | Song et al. | | 2002/0090320 A1 | 7/2002 | Burow et al. |
| 6,862,173 B1 | 3/2005 | Konshak et al. | | 2002/0116087 A1 | 8/2002 | Brown |
| 6,867,939 B2 | 3/2005 | Katahara et al. | | 2002/0161971 A1 | 10/2002 | Dimitri et al. |
| 6,892,328 B2 | 5/2005 | Klein et al. | | 2002/0172004 A1 | 11/2002 | Ives et al. |
| 6,904,479 B2 | 6/2005 | Hall et al. | | 2003/0035271 A1 | 2/2003 | Lelong et al. |
| 6,908,330 B2 | 6/2005 | Garrett et al. | | 2003/0043550 A1 | 3/2003 | Ives |
| 6,928,336 B2 | 8/2005 | Peshkin et al. | | 2003/0206397 A1 | 11/2003 | Allgeyer et al. |
| 6,937,432 B2 | 8/2005 | Sri-Jayantha et al. | | 2004/0165489 A1 | 8/2004 | Goodman et al. |
| 6,957,291 B2 | 10/2005 | Moon et al. | | 2004/0230399 A1 | 11/2004 | Shin |
| 6,965,811 B2 | 11/2005 | Dickey et al. | | 2004/0236465 A1 | 11/2004 | Butka et al. |
| 6,974,017 B2 | 12/2005 | Oseguera | | 2004/0264121 A1 | 12/2004 | Orriss et al. |
| 6,976,190 B1 | 12/2005 | Goldstone | | 2005/0004703 A1 | 1/2005 | Christie, Jr. |
| 6,980,381 B2 | 12/2005 | Gray et al. | | 2005/0010836 A1 | 1/2005 | Bae et al. |
| 6,982,872 B2 | 1/2006 | Behl et al. | | 2005/0018397 A1 | 1/2005 | Kay et al. |
| 7,006,325 B2 | 2/2006 | Emberty et al. | | 2005/0055601 A1 | 3/2005 | Wilson et al. |
| 7,039,924 B2 | 5/2006 | Goodman et al. | | 2005/0057849 A1 | 3/2005 | Twogood et al. |
| 7,054,150 B2 | 5/2006 | Orriss et al. | | 2005/0069400 A1 | 3/2005 | Dickey et al. |
| 7,070,323 B2 | 7/2006 | Wanek et al. | | 2005/0109131 A1 | 5/2005 | Wanek et al. |

| | | | | | | |
|---|---|---|---|---|---|---|
| 2005/0116702 A1 | 6/2005 | Wanek et al. | | EP | 1 045 301 A | 10/2000 |
| 2005/0131578 A1 | 6/2005 | Weaver | | EP | 1209557 | 5/2002 |
| 2005/0179457 A1 | 8/2005 | Min et al. | | EP | 1422713 | 5/2004 |
| 2005/0207059 A1 | 9/2005 | Cochrane | | EP | 1234308 | 5/2006 |
| 2005/0219809 A1 | 10/2005 | Muncaster et al. | | EP | 1760722 | 3/2007 |
| 2005/0225338 A1 | 10/2005 | Sands et al. | | EP | 1612798 | 11/2007 |
| 2005/0270737 A1 | 12/2005 | Wilson et al. | | GB | 2241118 | 8/1991 |
| 2006/0023331 A1 | 2/2006 | Flechsig et al. | | GB | 2276275 | 9/1994 |
| 2006/0028802 A1 | 2/2006 | Shaw et al. | | GB | 2299436 | 10/1996 |
| 2006/0066974 A1 | 3/2006 | Akamatsu et al. | | GB | 2312984 | 11/1997 |
| 2006/0130316 A1 | 6/2006 | Takase et al. | | GB | 2328782 | 3/1999 |
| 2006/0190205 A1 | 8/2006 | Klein et al. | | GB | 2439844 | 7/2008 |
| 2006/0227517 A1 | 10/2006 | Zayas et al. | | JP | 61-115279 | 6/1986 |
| 2006/0250766 A1 | 11/2006 | Blaalid et al. | | JP | 62-177621 | 8/1987 |
| 2006/0269384 A1 | 11/2006 | Kiaie et al. | | JP | 62-239394 | 10/1987 |
| 2007/0034368 A1 | 2/2007 | Atkins et al. | | JP | 62-251915 | 11/1987 |
| 2007/0035874 A1 | 2/2007 | Wendel et al. | | JP | 63-002160 | 1/1988 |
| 2007/0035875 A1 | 2/2007 | Hall et al. | | JP | 63-004483 | 1/1988 |
| 2007/0053154 A1 | 3/2007 | Fukuda et al. | | JP | 63-016482 | 1/1988 |
| 2007/0082907 A1 | 4/2007 | Canada et al. | | JP | 63-062057 | 3/1988 |
| 2007/0127202 A1 | 6/2007 | Scicluna et al. | | JP | 63-201946 | 8/1988 |
| 2007/0127206 A1 | 6/2007 | Wade et al. | | JP | 63-214972 | 9/1988 |
| 2007/0195497 A1 | 8/2007 | Atkins | | JP | 63-269376 | 11/1988 |
| 2007/0248142 A1 | 10/2007 | Rountree et al. | | JP | 63-195697 | 12/1988 |
| 2007/0253157 A1 | 11/2007 | Atkins et al. | | JP | 64-089034 | 4/1989 |
| 2007/0286045 A1 | 12/2007 | Onagi et al. | | JP | 2-091565 | 3/1990 |
| 2008/0007865 A1 | 1/2008 | Orriss et al. | | JP | 2-098197 | 4/1990 |
| 2008/0030945 A1 | 2/2008 | Mojaver et al. | | JP | 2-185784 | 7/1990 |
| 2008/0112075 A1 | 5/2008 | Farquhar et al. | | JP | 2-199690 | 8/1990 |
| 2008/0239564 A1 | 10/2008 | Farquhar et al. | | JP | 2-278375 | 11/1990 |
| 2008/0282275 A1 | 11/2008 | Zaczek et al. | | JP | 2-297770 | 12/1990 |
| 2008/0282278 A1 | 11/2008 | Barkley | | JP | 3-008086 | 1/1991 |
| 2009/0028669 A1 | 1/2009 | Rebstock | | JP | 3-078160 | 4/1991 |
| 2009/0082907 A1 | 3/2009 | Stuvel et al. | | JP | 3-105704 | 5/1991 |
| 2009/0122443 A1 | 5/2009 | Farquhar et al. | | JP | 3-207947 | 9/1991 |
| 2009/0142169 A1 | 6/2009 | Garcia et al. | | JP | 3-210662 | 9/1991 |
| 2009/0153992 A1 | 6/2009 | Garcia et al. | | JP | 3-212859 | 9/1991 |
| 2009/0153993 A1 | 6/2009 | Garcia et al. | | JP | 3-214490 | 9/1991 |
| 2009/0153994 A1 | 6/2009 | Merrow et al. | | JP | 3-240821 | 10/1991 |
| 2009/0175705 A1 | 7/2009 | Nakao et al. | | JP | 3-295071 | 12/1991 |
| 2009/0261047 A1 | 10/2009 | Merrow | | JP | 4-017134 | 1/1992 |
| 2009/0261228 A1 | 10/2009 | Merrow | | JP | 4-143989 | 5/1992 |
| 2009/0261229 A1 | 10/2009 | Merrow | | JP | 4-172658 | 6/1992 |
| 2009/0262444 A1 | 10/2009 | Polyakov et al. | | JP | 4-214288 | 8/1992 |
| 2009/0262445 A1 | 10/2009 | Noble et al. | | JP | 4-247385 | 9/1992 |
| 2009/0262454 A1 | 10/2009 | Merrow | | JP | 4-259956 | 9/1992 |
| 2009/0262455 A1 | 10/2009 | Merrow | | JP | 4-307440 | 10/1992 |
| 2009/0265032 A1 | 10/2009 | Toscano et al. | | JP | 4-325923 | 11/1992 |
| 2009/0265043 A1 | 10/2009 | Merrow et al. | | JP | 5-035053 | 2/1993 |
| 2009/0265136 A1 | 10/2009 | Garcia et al. | | JP | 5-035415 | 2/1993 |
| 2009/0297328 A1 | 12/2009 | Slocum, III | | JP | 5-066896 | 3/1993 |
| | | | | JP | 5-068257 | 3/1993 |
| FOREIGN PATENT DOCUMENTS | | | | JP | 5-073566 | 3/1993 |
| CN | 1177187 | 3/1998 | | JP | 5-073803 | 3/1993 |
| CN | 2341188 | 9/1999 | | JP | 5-101603 | 4/1993 |
| CN | 1114109 | 7/2003 | | JP | 5-173718 | 7/1993 |
| CN | 1192544 | 3/2005 | | JP | 5-189163 | 7/1993 |
| DE | 3786944 | 11/1993 | | JP | 5-204725 | 8/1993 |
| DE | 69111634 | 5/1996 | | JP | 5-223551 | 8/1993 |
| DE | 69400145 | 10/1996 | | JP | 6-004220 | 1/1994 |
| DE | 19701548 | 8/1997 | | JP | 6-004981 | 1/1994 |
| DE | 19804813 | 9/1998 | | JP | 6-162645 | 6/1994 |
| DE | 69614460 | 6/2002 | | JP | 6-181561 | 6/1994 |
| DE | 69626584 | 12/2003 | | JP | 6-215515 | 8/1994 |
| DE | 19861388 | 8/2007 | | JP | 6-274943 | 9/1994 |
| EP | 0210497 | 7/1986 | | JP | 6-314173 | 11/1994 |
| EP | 0242970 | 10/1987 | | JP | 7-007321 | 1/1995 |
| EP | 0 277 634 A | 8/1988 | | JP | 7-029364 | 1/1995 |
| EP | 0356977 | 8/1989 | | JP | 7-037376 | 2/1995 |
| EP | 0442642 | 2/1991 | | JP | 7-056654 | 3/1995 |
| EP | 0466073 | 7/1991 | | JP | 7-111078 | 4/1995 |
| EP | 0776009 | 11/1991 | | JP | 7-115497 | 5/1995 |
| EP | 0582017 | 2/1994 | | JP | 7-201082 | 8/1995 |
| EP | 0617570 | 9/1994 | | JP | 7-226023 | 8/1995 |
| EP | 0635836 | 1/1995 | | JP | 7-230669 | 8/1995 |
| EP | 741508 | 11/1996 | | JP | 7-257525 | 10/1995 |
| EP | 0757320 | 2/1997 | | JP | 1982246 | 10/1995 |
| EP | 0757351 | 2/1997 | | JP | 7-307059 | 11/1995 |
| EP | 0840476 | 5/1998 | | JP | 8007994 | 1/1996 |

| | | |
|---|---|---|
| JP | 8-030398 | 2/1996 |
| JP | 8-030407 | 2/1996 |
| JP | 8-079672 | 3/1996 |
| JP | 8-106776 | 4/1996 |
| JP | 8-110821 | 4/1996 |
| JP | 8-167231 | 6/1996 |
| JP | 8-212015 | 8/1996 |
| JP | 8-244313 | 9/1996 |
| JP | 8-263525 | 10/1996 |
| JP | 8-263909 | 10/1996 |
| JP | 8-297957 | 11/1996 |
| JP | 2553315 | 11/1996 |
| JP | 9-044445 | 2/1997 |
| JP | 9-064571 | 3/1997 |
| JP | 9-082081 | 3/1997 |
| JP | 2635127 | 7/1997 |
| JP | 9-306094 | 11/1997 |
| JP | 9-319466 | 12/1997 |
| JP | 10-040021 | 2/1998 |
| JP | 10-049365 | 2/1998 |
| JP | 10-064173 | 3/1998 |
| JP | 10-098521 | 4/1998 |
| JP | 2771297 | 7/1998 |
| JP | 10-275137 | 10/1998 |
| JP | 10-281799 | 10/1998 |
| JP | 10-320128 | 12/1998 |
| JP | 10-340139 | 12/1998 |
| JP | 2862679 | 3/1999 |
| JP | 11-134852 | 5/1999 |
| JP | 11-139839 | 5/1999 |
| JP | 2906930 | 6/1999 |
| JP | 11-203201 | 7/1999 |
| JP | 11-213182 | 8/1999 |
| JP | 11-327800 | 11/1999 |
| JP | 11-353128 | 12/1999 |
| JP | 11-353129 | 12/1999 |
| JP | 2000-056935 | 2/2000 |
| JP | 2000-066845 | 3/2000 |
| JP | 2000-112831 | 4/2000 |
| JP | 2000-113563 | 4/2000 |
| JP | 2000-114759 | 4/2000 |
| JP | 2000-125290 | 4/2000 |
| JP | 3052183 | 4/2000 |
| JP | 2000-132704 | 5/2000 |
| JP | 2000-149431 | 5/2000 |
| JP | 2000-228686 | 8/2000 |
| JP | 2000-235762 | 8/2000 |
| JP | 2000-236188 | 8/2000 |
| JP | 2000-242598 | 9/2000 |
| JP | 2000-278647 | 10/2000 |
| JP | 3097994 | 10/2000 |
| JP | 2000-305860 | 11/2000 |
| JP | 2001-005501 | 1/2001 |
| JP | 2001-023270 | 1/2001 |
| JP | 2001-100925 | 4/2001 |
| JP | 2002-42446 | 2/2002 |
| JP | 2007-87498 | 4/2007 |
| JP | 2007-188615 | 7/2007 |
| JP | 2007-220184 | 8/2007 |
| JP | 2007-293936 | 11/2007 |
| JP | 2007-305206 | 11/2007 |
| JP | 2007-305290 | 11/2007 |
| JP | 2007-328761 | 12/2007 |
| JP | 2008-503824 | 2/2008 |
| KR | 10-1998-0035445 | 8/1998 |
| KR | 10-0176527 | 11/1998 |
| KR | 10-0214308 | 8/1999 |
| KR | 10-0403039 | 10/2003 |
| SG | 45223 | 1/1998 |
| SG | 387574 | 4/2000 |
| WO | WO 89/01682 | 8/1988 |
| WO | WO 97/06532 | 2/1997 |
| WO | WO 00/49487 | 2/2000 |
| WO | WO 00/67253 | 11/2000 |
| WO | WO 01/09627 | 2/2001 |
| WO | WO 01/41148 | 6/2001 |
| WO | WO 03/013783 | 2/2003 |
| WO | WO 03/021597 | 3/2003 |
| WO | WO 03/021598 | 3/2003 |
| WO | WO 03/067385 | 8/2003 |
| WO | WO 2004/006260 | 1/2004 |
| WO | WO 2004/114286 | 12/2004 |
| WO | WO 2005/024830 | 3/2005 |
| WO | WO 2005/024831 | 3/2005 |
| WO | WO 2005/109131 | 11/2005 |
| WO | WO 2006/030185 | 3/2006 |
| WO | WO 2006/048611 | 5/2006 |
| WO | WO 2006/100441 | 9/2006 |
| WO | WO 2006/100445 | 9/2006 |
| WO | WO 2007/031729 | 3/2007 |

OTHER PUBLICATIONS

Abraham et al., "Thermal Proximity Imaging of Hard-Disk Substrates", IEEE Transactions on Mathematics 36:3997-4004, Nov. 2000.

Abramovitch, "Rejecting Rotational Disturbances on Small Disk Drives Using Rotational Accelerometers", Proceedings of the 1996 IFAC World Congress in San Francisco, CA, Jul. 1996 http://dabramovitch.com/pubs/amrfac_matj.pdf.

Ali et al., "Modeling and Simulation of Hard Disk Drive Final Assembly Using a HDD Template" Proceedings of the 2007 Winter Simulation Conference, IEEE pp. 1641-1650, 2007 http://portal.acm.org/citation.cfm?id=1351837.

Anderson et al., "Clinical chemistry: concepts and applications", The McGraw-Hill Companies, Inc., pp. 131-132, 2003.

Anderson et al., "High Reliability Variable Load Time Controllable Vibration Free Thermal Processing Environment", Delphion, hhttps://www.delphion.com/tdbs/tdb?order=93A+63418, 3 pages, Mar. 18, 2009.

Asbrand, "Engineers at One Company Share the Pride and the Profits of Successful Product Design", Professional Issues, 4 pages, 1987.

Bair et al., "Measurements of Asperity Temperatures of a Read/Write Head Slider Bearing in Hard Magnetic Recording Disks", Journal of Tribology 113:547-554, Jul. 1991.

Bakken et al., "Low Cost, Rack Mounted, Direct Access Disk Storage Device", www.ip.com, 4 pages, Mar. 3, 2005.

Biber et al., "Disk Drive Drawer Thermal Management", Advances in Electronic Packaging vol. 1:43-46, 1995.

Christensen, "How Can Great firms Fail? Insights from the hard Disk Drive Industry", Harvard Business School Press, pp. 1-26, 2006.

Chung et al., "Vibration Absorber for Reduction of the In-plane Vibration in an Optical Disk Drive", IEEE Transactions on Consumer Electronics, Vo. 48, May 2004.

Curtis et al., "InPhase Professional Archive Drive Architecture" Dec. 17, 2007 http://www.science.edu/TechoftheYear/Nominees/InPhase/Holographic%20Storage.pdf.

Findeis et al., "Vibration Isolation Techniques Sutiable for Portable Electronic Speckle Pattern Interferometry", Proc. SPIE vol. 4704, pp. 159-167, 2002 http://www.ndt.uct.ac.za/Papers/spiendt2002.pdf.

FlexStar Technology, "A World of Storage Testing Solutions," http://www.flexstar.com, 1 page (1999).

FlexStar Technology, "Environment Chamber Products," http://www.flexstar.com, 1 page (1999).

FlexStar Technology, "FlexStar's Family of Products," http://www.flexstar.com, 1 page (1999).

Frankovich, "The Basics of Vibration Isolation Using Elastomeric Materials", EARSC, 2005 http://www.isoloss.com/pdfs/engineering/BasicsofVibrationIsolation.pdf.

Grochowski et al., "Future Trends in Hard Disk Drives" IEEE Transactions on Magnetics, vol. 32, No. 3, pp. 1850-1854, May, 1996 http://svn.tribler.org/abc/branches/leo/dataset/preferences/johan/johan-68.pdf.

Gurumurthi et al., "Disk Drive Roadmap from the Thermal Perspective: A Case for Dynamic Thermal Management", International Symposium on Computer Architecture, Proceedings of the 32$^{nd}$ Annual International Symposium on Computer Architecture, IEEE Computer Society, pp. 38-49, 2005 http://portal.acm.org/citation.cfm?id=1069807.1069975.

Gurumurthi, "The Need for temperature-Aware Storage Systems", The Tenth Intersociety conference on Thermal and Thermomechanical Phenomena in Electronics, ITHERM pp. 387-394, 2006.

Gurumurthi et al., "Thermal Issues in Disk Drive Design: Challenges and Possible Solutions", ACM Transactions on Storage 2:41-73, Feb. 2006.

Haddad et al., "A new Mounting Adapter for Computer Peripherals with Improved Reliability, Thermal Distribution, Low Noise and Vibration Reduction", ISPS, Advances in Information Storage and Processing Systems, 1:97-108, 1995.

HighBeam Research website "ACT debuts six-zone catalytic gas heater. (American Catalytic Technologies offers new heaters)" www.highbeam.com, 4 pages, 1998.

HighBeam Research website "Asynchronous Testing Increases Throughput." www.highbeam.com, 7 pages, 2000.

HighBeam Research website "Credence announces Production Release of the EPRO AQ Series for Integrated Test and Back-end Processing." www.highbeam.com, 4 pages, 1995.

HighBeam Research website "Test Multiple Parts At Once for Air Leaks. (Brief Article)", www.highbeam.com, 1 page, 1999.

Iwamiya, "Hard Drive Cooling Using a Thermoelectric Cooler", EEP-vol. 19-2, Advances in Electronic Packaging, vol. 2:2203-2208, ASME 1997.

Johnson et al., "Performance Measurements of Tertiary Storage Devices", Proceedings of the 24th VLDB Conference, New York, pp. 50-61, 1998.

Ku, "Investigation of Hydrodynamic Bearing Friction in Data Storage information System Spindle Motors", ISPSvol. 1, Advances in Information Storage and Processing Systems, pp. 159-165, ASME 1995.

Lindner, "Disk drive mounting", IBM Technical Disclosure Brochure, vol. 16, No. 3, pp. 903-904, Aug. 1973.

McAuley, "Recursive Time Trapping for Synchronization of Product and Chamber Profiles for Stress Test", Delphion, www.delphion.com/tdbs/tdb?order=88A+60957, 3 pages, Mar. 18, 2009.

Morgenstern, Micropolis Drives Target High-end Apps; Technology Provides Higher Uninterrupted Data Transfer. (Applications; Microdisk AV LS 3020 and 1050AV and 1760AV LT Stackable Hard Drive Systems) (Product Announcement) MacWeek, vol. 8, No. 6, p. 8; Feb. 7, 1994.

Morris, "Zero Cost Power and Cooling Monitor System", www.delphion.com/tdbs/tdb?order=94A+61950, 3 pages, Jan. 15, 2008.

Nagarajan, "Survey of Cleaning and cleanliness Measurement in Disk Drive Manufacture", North Carolina Department of Environment and Natural Resources, Feb. 1997.

Notification of Transmittal of The International Search Report and the Written Opinion of the International Searching Authority, or the Declaration, PCT/US2008/086181, 15 pages, Mar. 16, 2009.

Park, "Vibration and Noise Reduction of an Optical Disk Drive by Using a Vibration Absorber Methods and Apparatus for Securing Disk Drives in a Disk", IEEE Transactions on Consumer Electronics, vol. 48, Nov. 2002.

Prater et al., "Thermal and Heat-Flow Aspects of Actuators for Hard Disk Drives", InterSociety Conference on Thermal Phenomena, pp. 261-268, 1994.

Ruwart et al., "Performance Impact of External Vibration on Consumer-grade and enterprise-class Disk Drives", Proceedings of the 22nd IEEE/13th Goddard Conference on Mass Storage Systems and Technologies, 2005.

Seagate Product Marketing, "Seagate's Advanced Multidrive System (SAMS) Rotational Vibration Feature", Publication TP-229D, Feb. 2000.

Schroeder et al., "Disk Failures in the Real World: What does an MTTP of 1,000,000 hours mean to you?", In FAST'07: 5th USENIX Conference on File and Storage Technologies, San Jose, CA, Feb. 14-16, 2007.

Schulze et al., "How Reliable is a Raid?," COMPCON Spring apos; 89. Thirty-Fouth IEEE Computer Society International Conference: Intellectual Leverage, Digest of papers; pp. 118-123, Feb. 27-Mar. 3, 1989.

Terwiesch et al., "An Exploratory Study of International Product Transfer and Production Ramp-Up in the Data Storage Industry", The Information Storage Industry Center, University of California, www-irps.ucsd.edu/~sloan/, pp. 1-31, 1999.

Tzeng, "Dynamic Torque Characteriestics of Disk-Drive Spindle Bearings", ISPS-vol. 1, Advances in Information Storage and Processing Systems, pp. 57-63, ASME 1995.

Tzeng, "Measurements of Transient Thermal Strains in a Disk-Drive Actuator", InterSociety conference on Thermal Phenomena, pp. 269-274, 1994.

Wilson-7000 disk Drive Analyzer Product Literature, date accessed Jan. 28, 2009, 2 pages.

Winchester, "Automation Specialists Use Machine Vision as a System Development Tool", IEE Computing & Control Engineering, Jun./Jul. 2003.

Xyratex website "Storage Infrastructure" www.xyratex.com/Products/storage-infrastructure/default.aspx 1995-2008.

Xyratex website "Production Test Systems" www.xyratex.com/Products/production-test-systems/default.aspx 1995-2008.

Xyratex website "Single cell—Production Test Systems" www.xyratex.com/products/production-test-systems/single-cell.aspx 1995-2008.

Xyratex website "Continuous Innovation—Production Test Systems" www.xyratex.com/products/production-test-systems/continuous-innovation.aspx 1995-2008.

Xyratex website "Key Advantages—Production Test Systems" www.xyratex.com/products/production-test-systems/advantages.aspx 1995-2008.

Xyratex website "Testing Drives Colder—Production Test Systems" www.xyratex.com/products/productino-test-systems/colder.aspx 1995-2008.

"Xyratex to Debut its New Automated Test Solution for 2.5-Inch Disk Drives at DISKCON USA 2004" 2004 PR Newswire Europe www.prnewswire.co.uk/cgi/news/release?id=130103.

"Automated Production Test Solutions", Xyratex Product Test brochure, 2006.

Xyratex "Process Challenges in the Hard Drive Industry" slide presentation, 2006 Asian Diskcon.

Suwa et al., "Evaluation System for Residual Vibration from HDD Mounting Mechanism" IEEE Transactions on Magnetics, vol. 35, No. 2, pp. 868-873, Mar. 1999.

Suwa et al., "Rotational Vibration Suppressor" IBM Technical Disclosure Bulletin Oct. 1991.

Yee Leong Low et al., "Thermal network model for temperature prediction in hard disk drive" Journal Microsystem Technologies, vol. 15, No. 10-11, pp. 1653-1656, Oct. 2009 http://www.springerlink.com/content/20668jn67pk426r5/.

Annex to Form PCT/ASA/206 Communication Relating to the Results of the Partial International Search, for International Application No. PCT/US2008/086814, dated Apr. 3, 2009, 5 pages.

Annex to Form PCT/ASA/206 Communication Relating to the Results of the Partial International Search, for International Application No. PCT/US2008/086809, dated Apr. 3, 2009, 1 page.

Notification of Transmittal of the International Search Report and the Written Opinion of the International Searching Authority, or the Declaration, for International Application No. PCT/US2009/039926, Sep. 1, 2009, 13 pages.

Notification of Transmittal of the International Search Report and the Written Opinion of the International Searching Authority, or the Declaration, for International Application No. PCT/US2009/039591, Aug. 31, 2009, 10 pages.

Notification of Transmittal of the International Search Report and the Written Opinion of the International Searching Authority, or the Declaration, for International Application No. PCT/US2008/086814, Sep. 18, 2009, 17 pages.

Notification of Transmittal of the International Search Report and the Written Opinion of the International Searching Authority, or the Declaration, for International Application No. PCT/US2009/039888, Sep. 28, 2009, 13 pages.

Notification of Transmittal of the International Search Report and the Written Opinion of the International Searching Authority, or the Declaration, for International Application No. PCT/US2009/039921, Sep. 25, 2009, 14 pages.

Notification of Transmittal of the International Search Report and the Written Opinion of the International Searching Authority, or the Declaration, for International Application No. PCT/US2009/040058, Sep. 29, 2009, 13 pages.

Notification of Transmittal of the International Search Report and the Written Opinion of the International Searching Authority, or the Declaration, for International Application No. PCT/US2009/040829, Oct. 28, 2009, 13 pages.

Notification of Transmittal of the International Search Report and the Written Opinion of the International Searching Authority, or the Declaration, for International Application No. PCT/US2009/039590, Oct. 30, 2009, 10 pages.

Notification of Transmittal of the International Search Report and the Written Opinion of the International Searching Authority, or the Declaration, for International Application No. PCT/US2009/040835, Oct. 30, 2009, 13 pages.

Notification of Transmittal of the International Search Report and the Written Opinion of the International Searching Authority, or the Declaration, for International U.S. Appl. No. PCT/US2009/040757, Nov. 24, 2009, 12 pages.

Notification of Transmittal of the International Search Report and the Written Opinion of the International Searching Authority, or the Declaration, for International Application No. PCT/US2009/039898, Nov. 24, 2009, 12 pages.

Notification of Transmittal of the International Search Report and the Written Opinion of the International Searching Authority, or the Declaration, for International Application No. PCT/US2009/040795, Nov. 26, 2009, 13 pages.

Notification of Transmittal of the International Search Report and the Written Opinion of the International Searching Authority, or the Declaration, for International Application No. PCT/US2009/045583, Nov. 27, 2009, 13 pages.

Notification of Transmittal of the International Search Report and the Written Opinion of the International Searching Authority, or the Declaration, for International Application No. PCT/US2009/040888, Dec. 29, 2009, 14 pages.

Notification of Transmittal of the International Search Report and the Written Opinion of the International Searching Authority, or the Declaration, for International Application No. PCT/US2009/040894, Dec. 22, 2009, 12 pages.

Notification of Transmittal of the International Search Report and the Written Opinion of the International Searching Authority, or the Declaration, for International Application No. PCT/US2009/039934, Dec. 23, 2009, 12 pages.

Notification of Transmittal of the International Search Report and the Written Opinion of the International Searching Authority, or the Declaration, for International Application No. PCT/US2009/040965, Dec. 23, 2009, 12 pages.

Notification of Transmittal of the International Search Report and the Written Opinion of the International Searching Authority, or the Declaration, for International Application No. PCT/US2009/040973, Jan. 11, 2010, 13 pages.

Cardinal Intellectual Property's search report including the results of a search for the features of the claims included in the U.S. patent application entitled "Vibration Isolation Within Disk Drive Testing Systems,", inventors: Brian S. Merrow and having assigned U.S. Appl. No. 12/767,142. The foregoing U.S. patent application is a continuation of U.S. Appl. No. 12/105,105. Revised as of Mar. 30, 2010.

Cardinal Intellectual Property's search report including the results of a search for the features of the claims included in the U.S. patent application entitled "Disk Drive Clamping Transport and Testing,", inventors: Brian S. Merrow et al., and having assigned U.S. Appl. No. 12/767,113. The foregoing U.S. patent application is a continuation of U.S. Appl. No. 11/959,133.

Cardinal Intellectual Property's search report including the results of a search for the features of the claims included in the U.S. patent application entitled "Disk Drive Clamping Transport and Testing,", inventors: Brian S. Merrow et al., and having assigned U.S. Appl. No. 12/766,680. The foregoing U.S. patent application is a continuation of U.S. Appl. No. 11/959,133. Revised as of Apr. 1, 2010.

Exhibit 1 in *Xyratex Technology, LTD* v. *Teradyne, Inc.*; Newspaper picture that displays the CSO tester; 1990.

Exhibit 2 in *Xyratex Technology, LTD* v. *Teradyne, Inc.*; Photos of the CSO tester obtained from Hitachi; 1990.

Exhibit 1326 in *Xyratex Technology, LTD* v. *Teradyne, Inc.*; Image of the back of Exhibit 1 and Exhibit 2 photos, which display the photos' dates; 1990.

Exhibit 1314 in *Xyratex Technology, LTD*. V. *Teradyne, Inc.*; Case, "Last products of Disk-File Development at Hursley and Millbrook," IBM, Oct. 12, 1990.

Exhibit 1315 in *Xyratex Technology, LTD*. V. *Teradyne, Inc.*: Case, "History of Disk-File Development at Hursley and Millbrook," IBM, Oct. 17, 1990.

*Xyratex Technology, LTD*. V. *Teradyne, Inc.*, Teradyne, Inc's Prior Art Notice Pursuant to 35 U.S.C. Section 282. Case No. CV 08-04545 SJO (PLAx), Oct. 16, 2009.

*Xyratex Technology, LTD*. V. *Teradyne, Inc.*, Amended Joint Trial Exhibit List of Xyratex and Teradyne. Case No. CV 08-04545 SJO (PLAx), Nov. 12, 2009.

Notification of Transmittal of the International Search Report and the Written Opinion of the International Searching Authority, or the Declaration, for International Application No. PCT/GB2005/003490, Jan. 26, 2006, 10 pages.

FlexStar Technology, 30E/Cascade Users Manual, Rev. 1.8, pp. 1-33, Jun. 1, 2004.

Henderson, "HAD High Aerial Densities Require Solid Test Fixtures", Flexstar Technology, Feb. 26, 2007.

Cardinal Intellectual Property's search report including the results of a search for the features of the claims included in the U.S. patent application entitled "Transferring Disk Drives Within Disk Drive Testing Systems", inventors: Polyakov et al, and having assigned U.S. Appl. No. 12/727,150. The foregoing U.S. patent application continuation of U.S. Appl. No. 12/104,536. Revised as of May 27, 2010.

Cardinal Intellectual Property's search report including the results of a search for the features of the claims included in the U.S. patent application entitled "Transferring Storage Devices Within Storage Device Testing Systems", inventors: John P. Toscano et al., and having assigned U.S. Appl. No. 12/727,201. The foregoing U.S. patent application is a continuation of U.S. Appl. No. 12/424,980. Revised as of Jan. 4, 2010.

Cardinal Intellectual Property's search report including the results of a search for the features of the claims included in the U.S. patent application entitled "Processing Storage Devices", inventors: Richard W. Slocum III., and having assigned U.S. Appl. No. 12/727,619. The foregoing U.S. patent application is a continuation of U.S. Appl. No. 12/474,388. Revised as of Jan. 5, 2010.

Cardinal Intellectual Property's search report including the results of a search for the features of the claims included in the U.S. patent application entitled "Bulk Feeding Disk Drives To Disk Drive Testing Systems", inventors: Noble et al., and having assigned U.S. Appl. No. 12/726,856. The foregoing U.S. patent application is a continuation of U.S. Appl. No. 12/104,869. Revised as of Jan. 15, 2010.

Cardinal Intellectual Property's search report including the results of a search for the features of the claims included in the U.S. patent application entitled "Dependent Temperature Control Within Disk Drive Testing Systems", inventors: Merrow et al., and having assigned U.S. Appl. No. 12/727,207. The foregoing U.S. patent application is a continuation of U.S. Appl. No. 12/105,069. Revised as of Jan. 13, 2010.

Cardinal Intellectual Property's search report including the results of a search for the features of the claims included in the U.S. patent application entitled "Test Slot Cooling System for a Storage Device Testing System", inventors: Merrow et al., and having assigned U.S. Appl. No. 12/727,700. The foregoing U.S. patent application is a continuation of U.S. Appl. No. 12/503,567. Revised as of Jan. 13, 2010.

Cardinal Intellectual Property's search report including the results of a search for the features of the claims included in the U.S. patent application entitled "Storage Device Testing System Cooling", inventors: Brian S. Merrow and having assigned U.S. Appl. No. 12/775,560. The foregoing U.S. patent application is a continuation of U.S. Appl. No. 12/698,575. Revised as of Feb. 17, 2010.

Cardinal Intellectual Property's search report including the results of a search for the features of the claims included in the U.S. patent application entitled "Conductive Heating", inventors: Brian S. Merrow et al., and having assigned U.S. Appl. No. 12/760,164. The foregoing U.S. patent application is a continuation of U.S. Appl. No. 12/503,593. Revised as of Jan. 6, 2010.

Cardinal Intellectual Property's search report including the results of a search for the features of the claims included in the U.S. patent application entitled "Storage Device Temperature Sensing", inventors: Brian S. Merrow et al., and having assigned U.S. Appl. No. 12/760,305. The foregoing U.S. patent application is a continuation of U.S. Appl. No. 12/503,687. Revised as of Jan. 7, 2010.

Cardinal Intellectual Property's search report including the results of a search for features included in U.S. patent application entitled "Solid State Temperature Control of Hard Drive Tester", U.S. Appl. No. 12/105,103. Revised as of Jan. 14, 2010.

Cardinal Intellectual Property's search report including the results of a search for the features of the claims included in the U.S. patent application entitled "Vibration Isolation Within Disk Drive Testing Sytems", inventors: Brian S. Merrow and having assigned U.S. Appl. No. 12/767,142. The foregoing U.S. application is a continuation of U.S. Appl. No. 12/105,105. Revised as of Jan. 12, 2010.

Cardinal Intellectual Property's search report including the results of a search for the features of the claims included in the U.S. patent application entitled "Disk Drive Clamping Transport and Testing", inventors: Brian S. Merrow et al., and having assigned U.S. Appl. No. 12/766,680. The foregoing U.S. patent application is a continuation of U.S. Appl. No. 11/959,133. Revised as of Jan. 14, 2010.

Cardinal Intellectual Property's search report including the results of a search for the features of the claims included in the U.S. patent application entitled "Chilled Water Temp Control of Disk Drive Tester", inventors: Brian S. Merrow and having assigned U.S. Appl. No. 12/766,680. The foregoing U.S. patent application is a continuation of U.S. Appl. No. 12/ 105,061. Revised as of Feb. 18, 2010.

Cardinal Intellectual Property's search report including the results of a search for the features of the claims included in the U.S. patent application entitled "Disk Drive Clamping Transport and Testing", inventors: Brian S. Merrow et al., and having assigned U.S. Appl. No. 12/767,113. The foregoing U.S. patent application is a continuation of U.S. Appl. No. 11/959,133. Revised as of Apr. 4, 2010.

International Search Report and Written Opinion dated Feb. 21, 2011 issued in International Application No. PCT/US2010/041831, 10 pgs.

* cited by examiner

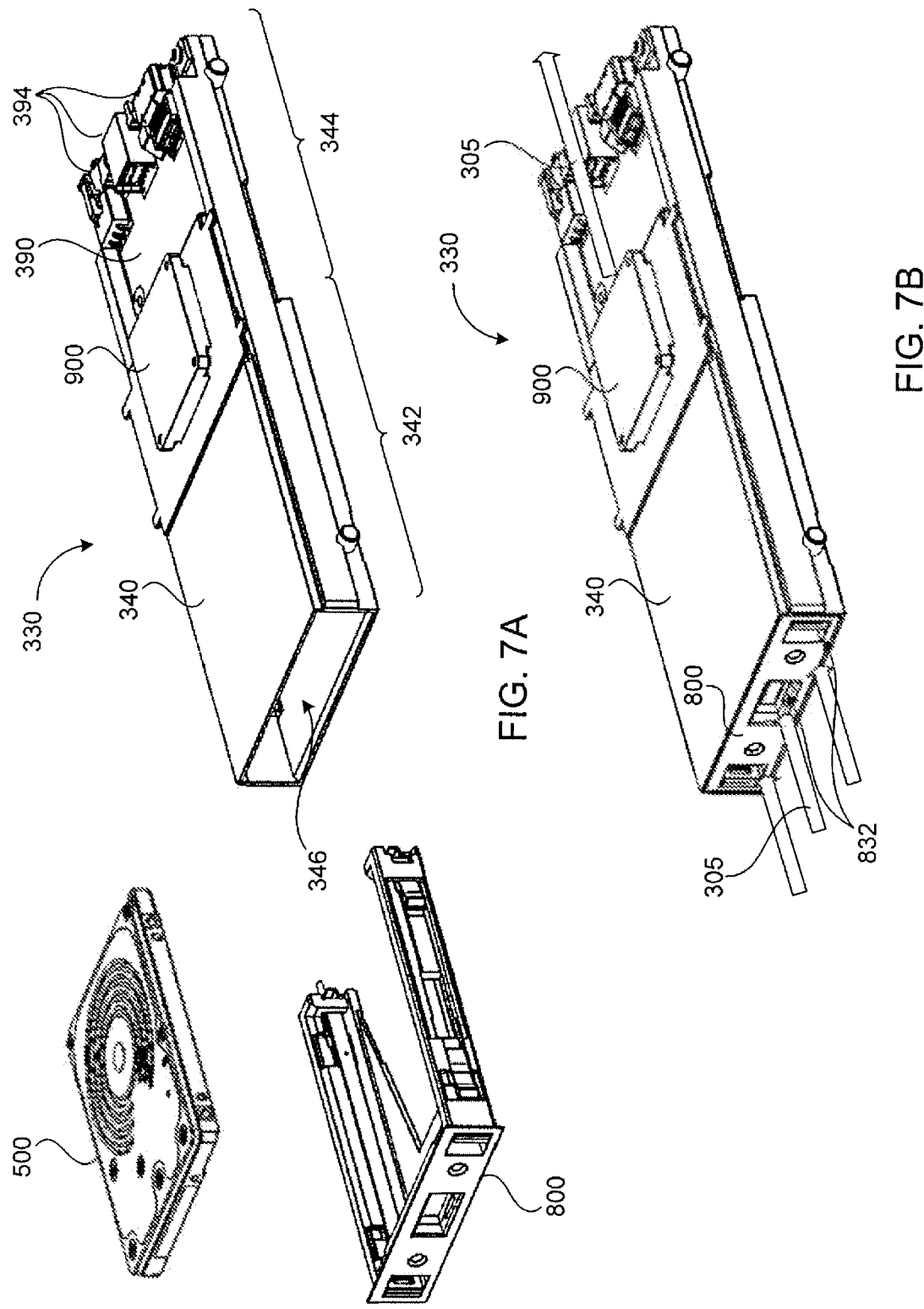

STORAGE DEVICE TESTING SYSTEM COOLING

RELATED APPLICATIONS

This application is a continuation and claims the benefit of priority under 35 U.S.C. §120 of U.S. application Ser. No. 12/698,575, filed Feb. 2, 2010. The disclosure of the prior application is considered part of, and is incorporated by reference in, the disclosure of this application.

TECHNICAL FIELD

This disclosure relates to cooling a storage device testing system.

BACKGROUND

Storage device manufacturers typically test manufactured storage devices for compliance with a collection of requirements. Test equipment and techniques exist for testing large numbers of storage devices serially or in parallel. Manufacturers tend to test large numbers of storage devices simultaneously in batches. Storage device testing systems typically include one or more racks having multiple test slots that receive storage devices for testing.

During the manufacture of disk drives or other storage devices, it is common to control the temperature of the storage devices, e.g., to ensure that the storage devices are functional over a predetermined temperature range. For this reason, the testing environment immediately around the storage devices can be varied under program control. In some known testing systems, sometimes called "batch testers," the temperature of plural storage devices is adjusted by using cooling or heating air which is common to all of the storage devices.

Batch testers generally require all storage device tests to be at substantially the same temperature, and require all storage devices to be inserted or removed from the test system at substantially the same time. Storage devices generally vary substantially in both the time required to test them and the amount of time that each test requires a particular ambient temperature. Because of these variations, batch testers tend to inefficiently use available testing capacity. There are also known testing systems that allow separate control of the insertion, removal, and temperature of each storage device. These test systems tend to more efficiently use the available testing capacity, but require duplication of temperature control components across every test slot, or sharing of those components among a small number of test slots.

Some storage device test systems use heated or cooled air to heat or cool the storage device. For separate thermal control of each storage device, a separate closed-loop air flow is sometimes used, with heaters or coolers disposed in the air flow. In some examples, the storage device is allowed to self-heat, and thus only a cooler is used. Heating may also be enhanced by reducing or otherwise controlling the flow of the air, and cooling may also be enhanced by increasing the air flow. In some examples of separate thermal control of each storage device, air is drawn from ambient air outside of the tester, rather than through a cooler that draws heat from a closed loop air flow.

Disadvantages of systems with separate thermal controls for each test slot include the need for many separate thermal control components for each test slot (e.g., heaters, coolers, fans, and/or controllable baffles). In addition, efficient use of energy generally requires each test slot to have a closed loop air flow system during at least some of the operating time. A closed loop air flow system typically requires ducting for the air to flow in both directions, which requires additional space for the air return path. In addition, coolers may create condensation when operating below the dew point of the air. The formation of condensation may be avoided at the cost of reduced cooling performance, by limiting the coolant temperature. Alternatively, the formation of condensation may be avoided controlling and/or removing the moisture content in the air.

SUMMARY

The present disclosure provides a storage device testing system that reduces the number of temperature control components generally required, while still allowing separate control of the temperature of each test slot, thus achieving greater test slot density and lower cost. The storage device testing system provides separate thermal control for each storage device test slot, with relatively fewer thermal control components, and without a separate closed loop air flow path for each test slot. The thermal control for a storage device testing system results in substantially no condensation forming in or near the test slot, without having to manage the moisture content of the air. The storage device testing system uses a common reservoir of cooled air, which is cooled by relatively few heat exchangers. Condensation formed on the heat exchangers is concentrated in relatively few locations and may be removed by conventional methods, such as evaporators or drains. Alternatively, the heat exchangers may be controlled to operate above the dew point. Air from the common reservoir is drawn though each test slot using a separate controllable air mover for each test slot. The amount of cooling may be controlled by the speed of the air mover. To heat a storage device received in a test slot, a heater may be placed in an inlet air path to the test slot, a direct contact heater may be placed on the received storage device, or the storage device may be allowed to self heat by reducing or shutting off the air flow through the test slot. In some implementations, the reservoir of cooled air is formed by the shape of the storage device testing system, rather than by a separate enclosure. The cooling air may also be used to cool other electronics disposed with in the storage device testing system.

One aspect of the disclosure provides a storage device testing system that includes at least one rack, at least one test slot housed by each rack, and at least one air mover in pneumatic communication with the test slots. Each test slot includes a test slot housing having an entrance and an exit, with the entrance configured to receive a storage device. The at least one air mover is configured to move air exterior to the at least one rack into the entrance of each test slot housing, over the received storage device, and out of the exit of each test slot housing.

Implementations of the disclosure may include one or more of the following features. In some implementations, each rack includes an air conduit pneumatically connecting the test slots of the rack to the at least one air mover. The at least one air mover moves air out of the exit of each test slot housing through the air conduit and to an environment outside of the rack (e.g., via an air exit of the rack). In some examples, the exit of each test slot housing of each rack is in pneumatic communication with the at least one air mover. In other examples, the at least one air mover is disposed on each rack in pneumatic communication with the test slots of the respective rack. In some implementations, each test slot housing has first and second portions. The first portion of the test slot housing defines the entrance and is configured to receive a storage device. The at least one air mover is dedicated to its assigned test slot, for controlling air flow through that test slot. In some examples, the at least one air mover is in pneumatic communication with the second portion of the test slot housing, while in other examples the air mover is disposed exterior or adjacent to the test slot housing. The air mover, in some examples, includes an air entrance and an air exit. The air mover receives air along a first direction through its air entrance and delivers air out of its air exit along a second direction substantially perpendicular to the first direction.

The test slot housing entrance may be configured to receive a storage device transporter, which has first and second portions. The first portion of the storage device transporter includes an air director and the second portion of the storage device transporter is configured to receive the storage device. The air director directs air substantially simultaneously over at least top and bottom surfaces of the storage device received in the storage device transporter. Air exterior to the racks is moved into the air director of the received storage device transporter of the respective test slot over the received storage device and out the respective test slot exit by the at least one air mover. The air director of the received storage device transporter defines at least one air entrance, the storage device having top, bottom, front, rear, right, and left side surfaces. The front storage device surface has an electrical connector. The storage device is received with its rear surface substantially facing the first portion of the storage device transporter, and the at least one air entrance directs air over at least the top and bottom surfaces of the received storage device.

Another aspect of the disclosure provides a storage device testing system that includes at least one rack, an air heat exchanger in pneumatic communication with at least one rack, and test slots housed by each rack. Each test slot includes a test slot housing defining an entrance and an exit. The entrance is configured to receive a storage device and the exit is in pneumatic communication with the air heat exchanger. A test slot air mover is disposed in pneumatic communication with the test slot housing and is configured to move air into the test slot housing entrance, over the received storage device, and out of the test slot housing exit. Air exterior to the racks is moved into the test slot housing entrance, over the received storage device, by the respective test slot air mover and moved out the respective test slot housing exit and out of the respective rack. The air is moved through the air heat exchanger before and/or after passing over the received storage device Implementations of the disclosure may include one or more of the following features. In some implementations, each rack includes an air conduit that provides pneumatic communication between each test slot housing exit and the air heat exchanger. The air heat exchanger may be remote to the test slots or adjacent the test slots. The air heat exchanger includes an air heat exchanger housing defining an entrance, an exit, and an air flow path therebetween. The air heat exchanger includes cooling elements disposed in the air flow path, and may include a pump or drain that delivers condensation accumulated from the air heat exchanger (if operating below dew point) out of the air heat exchanger, for example, to an evaporator or a drain. The evaporator may be disposed on the respective rack of the air heat exchanger in fluid communication with the at least one of the pump and the drain. In some examples, the air heat exchanger includes an air heat exchanger air mover for moving air into the air heat exchanger housing entrance over the cooling elements and out of the air heat exchanger housing exit.

In some implementations, the test slot housing entrance is configured to receive a storage device transporter. The storage device transporter has first and second portions. The first portion of the storage device transporter includes an air director and the second portion of the storage device transporter is configured to receive the storage device. The air director directs air substantially simultaneously over at least top and bottom surfaces of the storage device received in the storage device transporter. Air exterior to the racks is moved into the air director of the received storage device transporter of the respective test slot over the received storage device by the respective test slot air mover and moved out the respective test slot exit through the air heat exchanger and out of the respective rack. In some examples, the air director of a received storage device transporter defines at least one air entrance. The storage device has top, bottom, front, rear, right, and left side surfaces, with the front storage device surface having an electrical connector. The storage device is received with its rear surface substantially facing the first portion of the storage device transporter. The at least one air entrance directs air over at least the top and bottom surfaces of the received storage device. In some implementations, the second portion of the storage device transporter includes first and second arms configured to receive a storage device.

In some implementations, the air mover includes an air entrance and an air exit. The air mover receives air along a first direction through its air entrance and delivers air out of its air exit along a second direction substantially perpendicular to the first direction. The air mover may include an air mover body having a width of about 45 mm, a length of about 45 mm, and a height of about 10 mm. The air mover can be configured to produce an air flow rate between 0 and about 0.122 m$^3$/min (4.308 CFM) and an air pressure between 0 and about 20.88 mmH$_2$O (0.822 inchH$_2$O).

The storage device testing system, in some implementations, includes at least one robotic arm defining a first axis substantially normal to a floor surface. The robotic arm is operable to rotate through a predetermined arc about, and extend radially from, the first axis. The racks are arranged around the robotic arm for servicing by the robotic arm. In some examples, the racks are arranged equidistantly radially away from the first axis of the robotic arm.

Another aspect of the disclosure provides a method of regulating the temperature of a storage device received in a storage device testing system. The method includes moving a flow of air into an air entrance of a test slot housing of a test slot received in a rack, moving the air flow over a storage device received in the test slot, moving the air out an air exit of the test slot housing of a test slot, and releasing the air exteriorly of the rack.

Implementations of the disclosure may include one or more of the following features. In some implementations, the method includes moving the air flow substantially simultaneously over at least top and bottom surfaces of a storage device received in the test slot. The method may include moving air exterior to the rack into the test slot housing entrance, over the received storage device, and moving the air out the test slot housing exit through an air conduit and out of the rack. The air conduit is in pneumatic communication with the exits of each test slot housing in the rack. In some examples, the air is moved through the test slots and the air conduit with an air mover pneumatically connected to the air conduit. The air may be moved through the test slots with a test slot air mover and into the air conduit for deliverance out of the rack.

The method may include moving air exterior to the rack into the test slot housing entrance, over the received storage device, by a test slot air mover of the test slot, and moving the air out the test slot housing exit through an air heat exchanger. Moving the air out of the test slot housing exit to the air heat exchanger may include moving the air through an air conduit in pneumatic communication with the test slot housing exit of each test slot of the rack and the air heat exchanger.

In some implementations, the method includes moving the air through the air heat exchanger with an air heat exchanger air mover. The air heat exchanger air mover moves air from the air conduit into an entrance of the air heat exchanger, over cooling elements of the air heat exchanger, and out an exit of the air heat exchanger. The method may include pumping or otherwise moving condensation (e.g., of the air heat exchanger) out of the rack (e.g., to an evaporator or drain).

In some implementations, the method includes receiving the flow of air from over the received storage device into an air mover along a first direction and delivering the air flow from the air mover to the test slot housing exit along a second direction substantially perpendicular to the first direction. The method may include moving the flow of air into an air entrance of a storage device transporter received in the entrance of the test slot housing. The storage device transporter supports the received storage device in pneumatic communication with the air entrance of the storage device transporter. In some examples, the method includes moving the flow of air through an air director of the storage device transporter. The air director directs the air flow over at least the top and bottom surfaces of the received storage device. In some implementations, the storage device transporter has first and second portions. The first portion includes the air director and the second portion is configured to receive the storage device. The storage device has top, bottom, front, rear, right, and left side surfaces, with the front storage device surface having an electrical connector. The method may include receiving the storage device with its rear surface substantially facing the first portion of the storage device transporter.

The details of one or more implementations of the disclosure are set forth in the accompanying drawings and the description below. Other features, objects, and advantages will be apparent from the description and drawings, and from the claims.

DESCRIPTION OF DRAWINGS

FIGS. 7A and 7B are perspective views of a test slot receiving a storage device transporter carrying a storage device.

Like reference symbols in the various drawings indicate like elements.

DETAILED DESCRIPTION

Temperature regulation of a storage device can be an important factor during testing (e.g., validation, qualification, functional testing, etc.) of the storage device. One method of performing temperature regulation includes moving air over and/or about the storage device during testing. As will be discussed in detail, the volume, temperature, and flow path of the air moved with respect to the storage device during testing, inter alia, can each be factors in providing reliable, effective, and efficient temperature control of the storage device.

A storage device, as used herein, includes disk drives, solid state drives, memory devices, and any device that benefits from asynchronous testing for validation. A disk drive is generally a non-volatile storage device which stores digitally encoded data on rapidly rotating platters with magnetic surfaces. A solid-state drive (SSD) is a data storage device that uses solid-state memory to store persistent data. An SSD using SRAM or DRAM (instead of flash memory) is often called a RAM-drive. The term solid-state generally distinguishes solid-state electronics from electromechanical devices.

Figure 1:
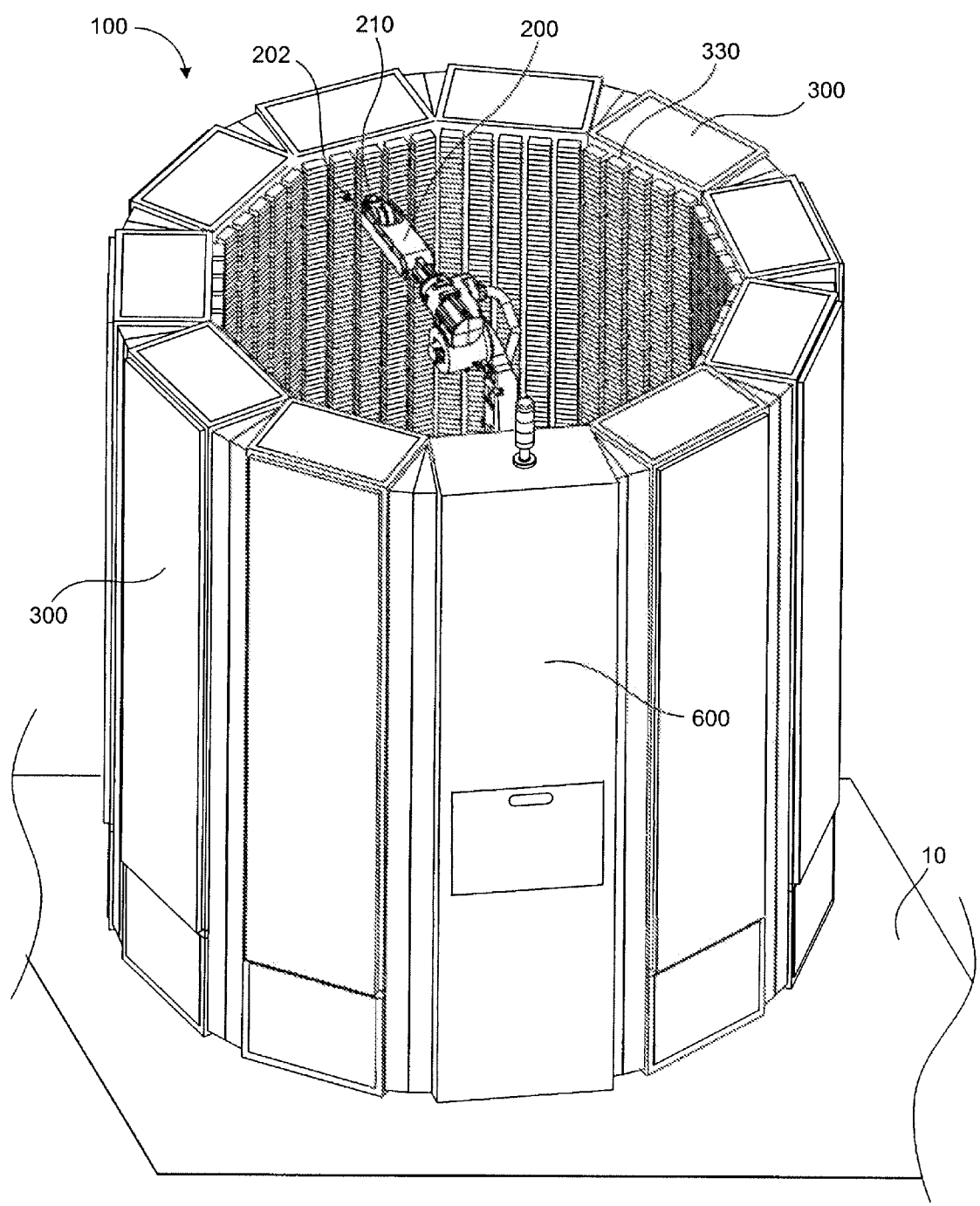
FIG. 1 is a perspective view of a storage device testing system having racks arranged in a substantially circular configuration.
Figure 2:
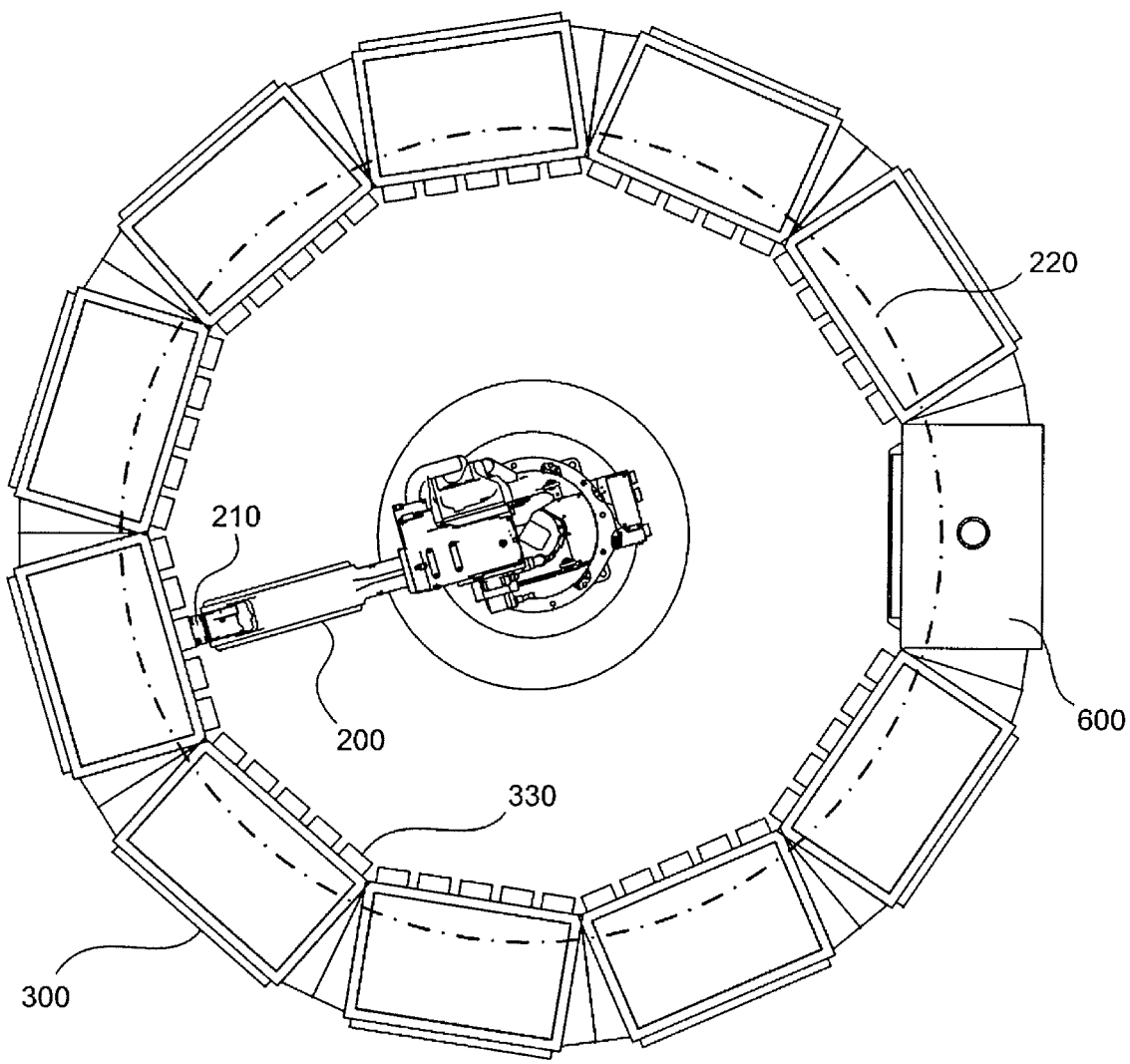
FIG. 2 is a top view of the storage device testing system shown in FIG. 1.
Figure 3:
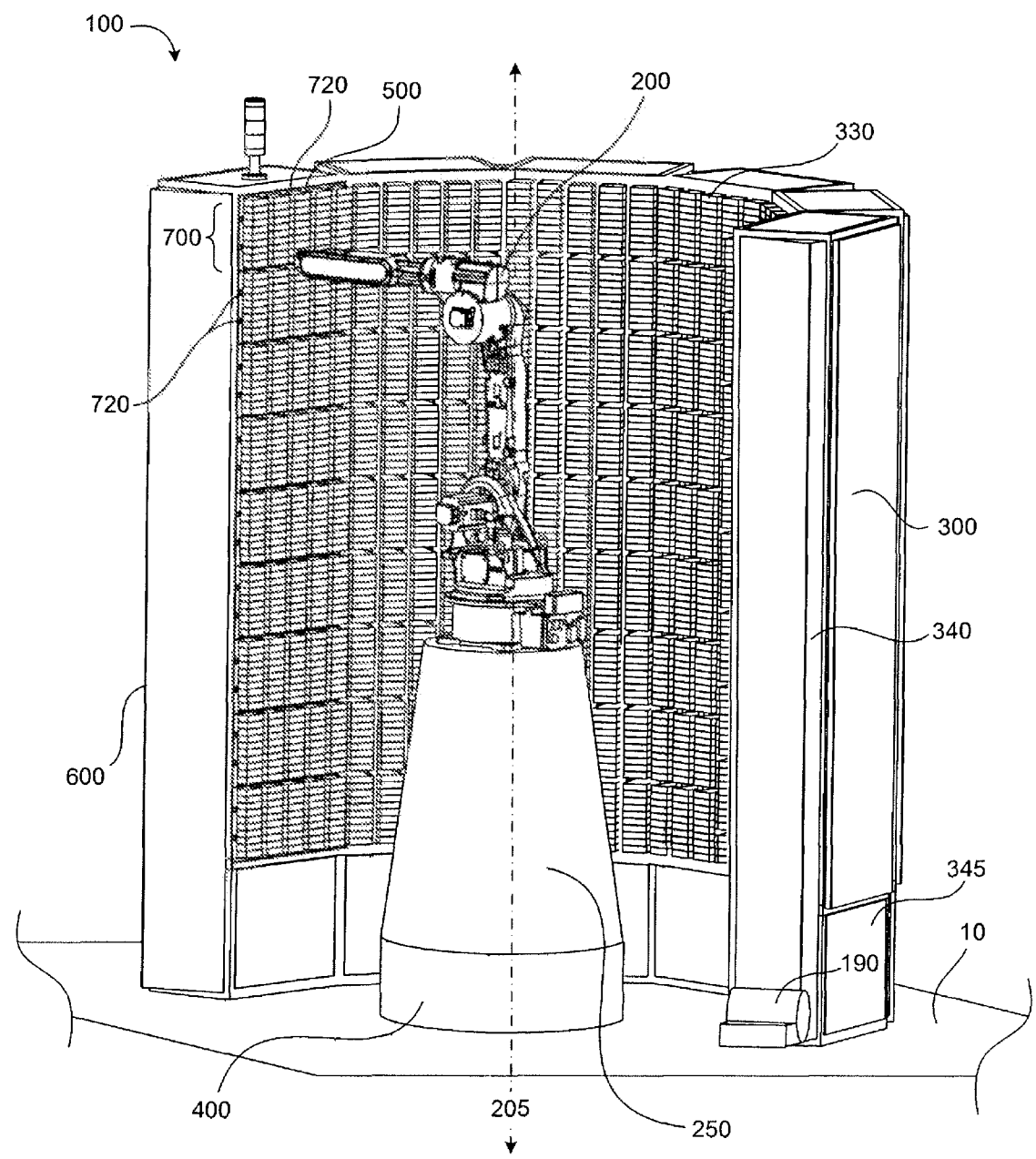
FIG. 3 is a perspective view of a storage device testing system and a transfer station.

Referring to FIGS. 1-3, in some implementations, a storage device testing system 100 includes at least one automated transporter 200 (e.g. robot, robotic arm, gantry system, or multi-axis linear actuator) defining a first axis 205 (see FIG. 3) substantially normal to a floor surface 10. In the examples shown, the automated transporter 200 comprises a robotic arm 200 operable to rotate through a predetermined arc about the first axis 205 and to extend radially from the first axis 205. The robotic arm 200 is operable to rotate approximately 360° about the first axis 205 and includes a manipulator 210 disposed at a distal end 202 of the robotic arm 200 to handle one or more storage devices 500 and/or storage device transporters 800 to carry the storage devices 500 (see e.g., FIGS. 4A-4D). Multiple racks 300 are arranged around the robotic arm 200 for servicing by the robotic arm 200. Each rack 300 houses multiple test slots 330 configured to receive storage devices 500 for testing. The robotic arm 200 defines a substantially cylindrical working envelope volume 220, with the racks 300 being arranged within the working envelope 220 for accessibility of each test slot 330 for servicing by the robotic arm 200. The substantially cylindrical working envelope volume 220 provides a compact footprint and is generally only limited in capacity by height constraints. In some examples, the robotic arm 200 is elevated by and supported on a pedestal or lift 250 on the floor surface 10. The pedestal or lift 250 increases the size of the working envelope volume 220 by allowing the robotic arm 200 to reach not only upwardly, but also downwardly to service test slots 330. The size of the working envelope volume 220 can be further increased by adding a vertical actuator to the pedestal or lift 250. A controller 400 (e.g., computing device) communicates with each automated transporter 200 and rack 300. The controller 400 coordinates servicing of the test slots 330 by the automated transporter(s) 200.

The robotic arm 200 is configured to independently service each test slot 330 to provide a continuous flow of storage devices 500 through the testing system 100. A continuous flow of individual storage devices 500 through the testing system 100 allows varying start and stop times for each storage device 500, whereas other systems that require batches of storage devices 500 to be run all at once as an entire testing loaded must all have the same start and end times. Therefore, with continuous flow, storage devices 500 of different capacities can be run at the same time and serviced (loaded/unloaded) as needed.

Referring to FIGS. 1-3, the storage device testing system 100 includes a transfer station 600 configured for bulk feeding of storage devices 500 to the robotic arm 200. The robotic arm 200 independently services each test slot 330 by transferring a storage device 500 between the transfer station 600 and the test slot 330. The transfer station 600 houses one or more totes 700 carrying multiple storage devices 500 presented for servicing by the robotic arm 200. The transfer station 600 is a service point for delivering and retrieving storage devices 500 to and from the storage device testing system 100. The totes 700 allow an operator to deliver and retrieve a collection of storage devices 500 to and from the transfer station 600. In the example shown in FIG. 3, each tote 700 is accessible from respective tote presentation support systems 620 in a presentation position and may be designated as a source tote 700 for supplying a collection of storage devices 500 for testing or as a destination tote 700 for receiving tested storage devices 500 (or both). Destination totes 700 may be classified as "passed return totes" or "failed return totes" for receiving respective storage devices 500 that have either passed or failed a functionality test, respectively.

In implementations that employ storage device transporters 800 (FIGS. 4A-4D) for manipulating storage devices 500, the robotic arm 200 is configured to remove a storage device transporter 800 from one of the test slots 330 with the manipulator 210, then pick up a storage device 500 from one the totes 700 presented at the transfer station 600 or other presentation system (e.g., conveyor, loading/unloading station, etc.) with the storage device transporter 800, and then return the storage device transporter 800, with a storage device 500 therein, to the test slot 330 for testing of the storage device 500. After testing, the robotic arm 200 retrieves the tested storage device 500 from the test slot 330, by removing the storage device transporter 800 carrying the tested storage device 500 from the test slot 330 (i.e., with the manipulator 210), carrying the tested storage device 500 in the storage device transporter 800 to the transfer station 600, and manipulating the storage device transporter 800 to return the tested storage device 500 to one of the totes 700 at the transfer station 600 or other system (e.g., conveyor, loading/unloading station, etc.).

Figure 4A:
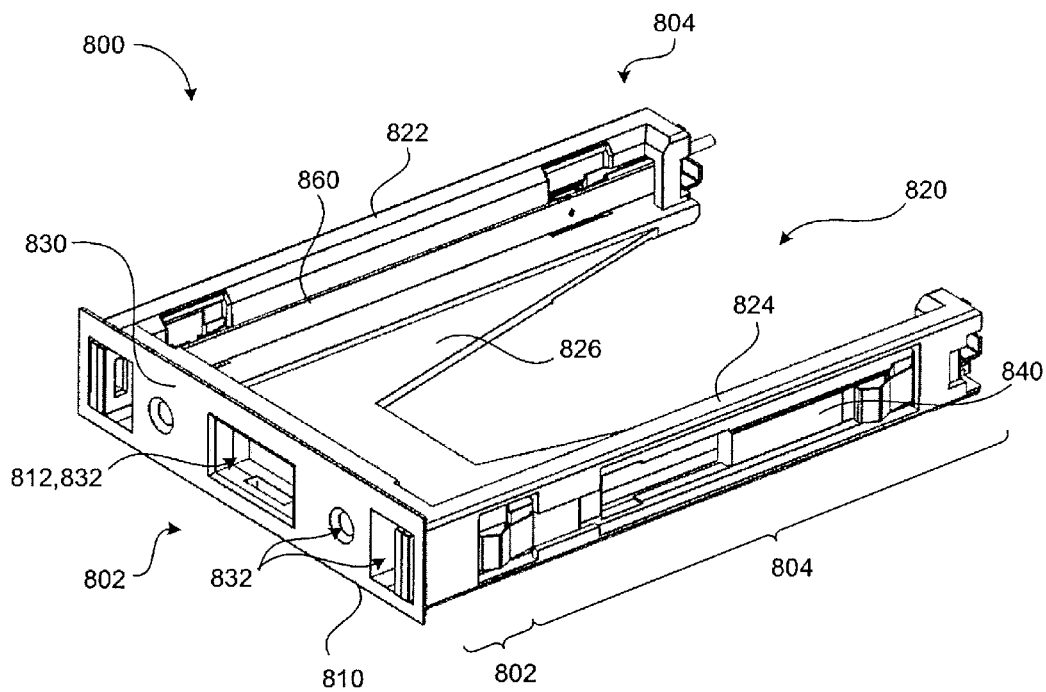
FIG. 4A is a side perspective view of a storage device transporter.
Figure 4B:
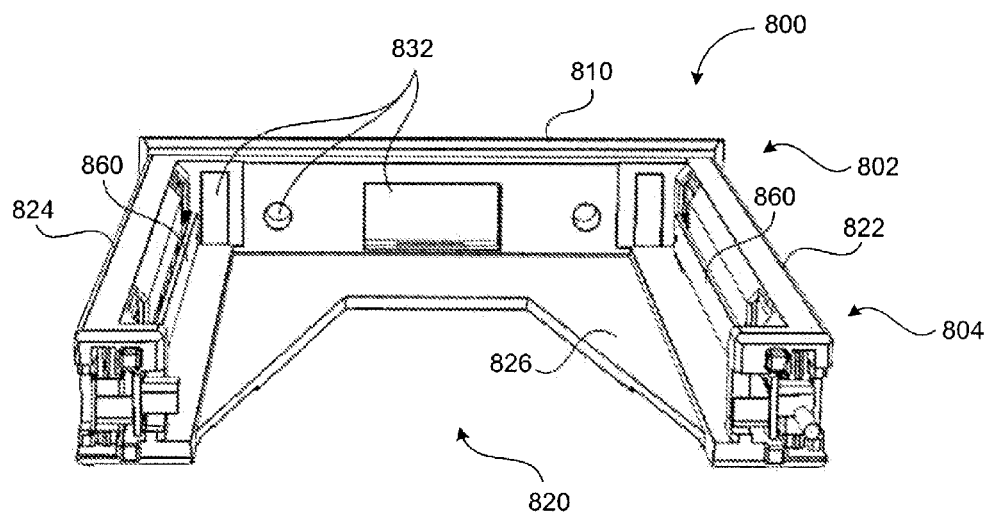
FIG. 4B is a front perspective views of the storage device transporter shown in FIG. 4A.
Figure 4C:
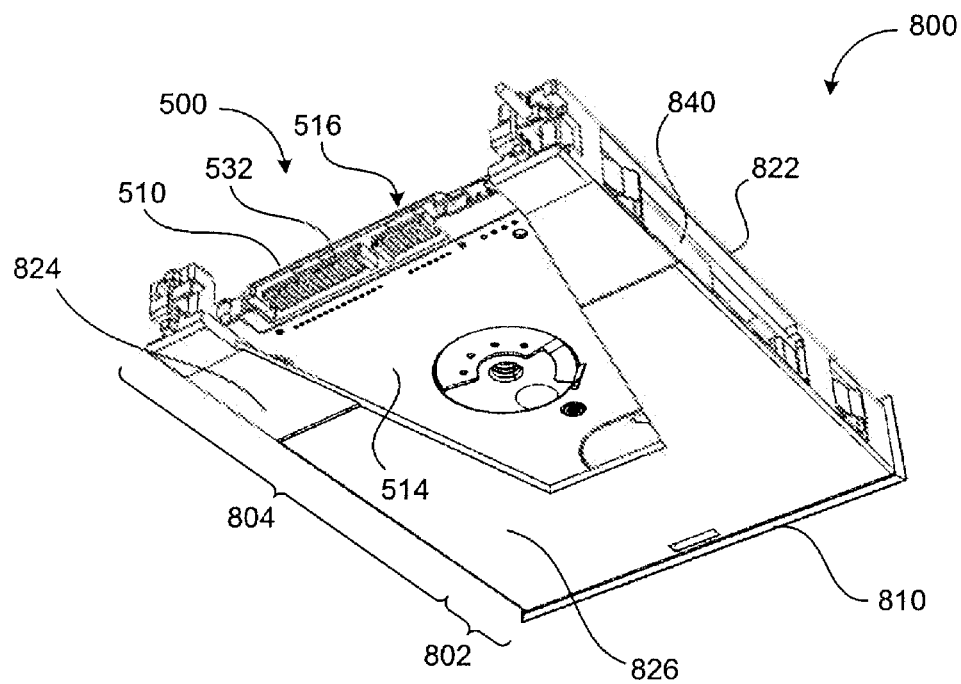
FIG. 4C is a bottom perspective views of a storage device transporter carrying a storage device.
Figure 4D:
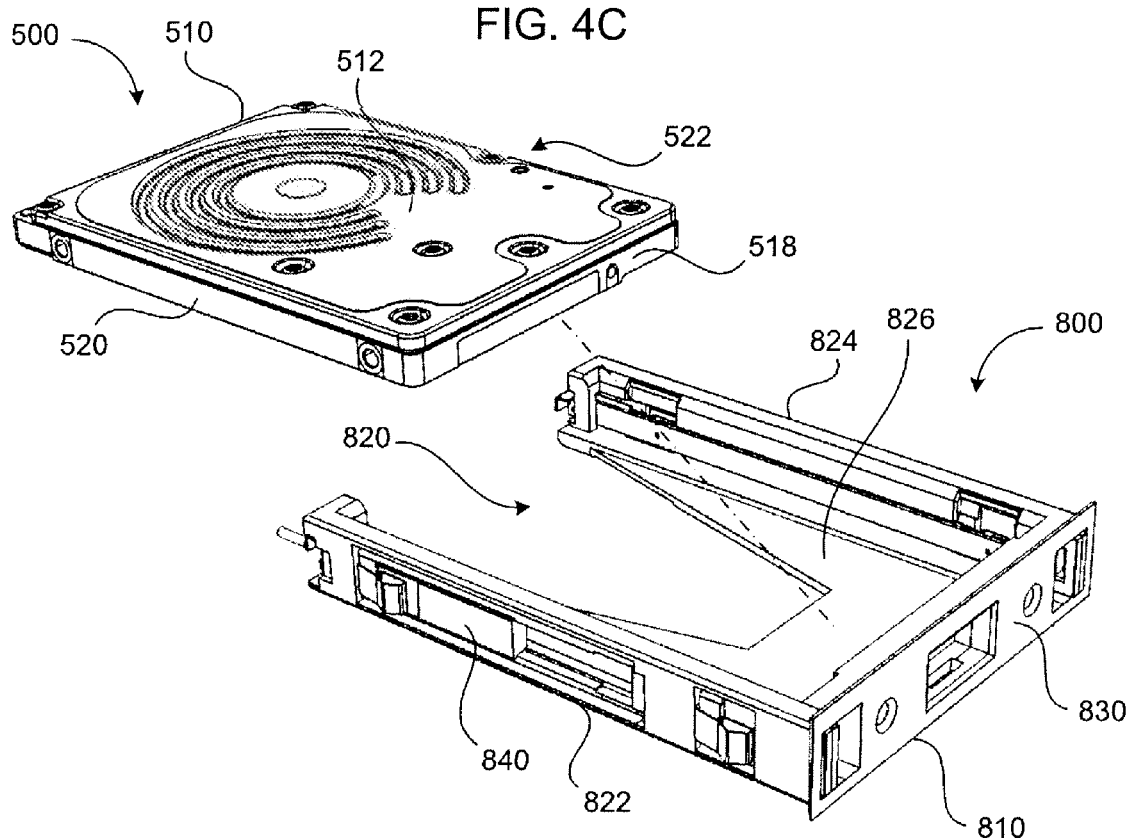
FIG. 4D is a side perspective views of a storage device transporter receiving a storage device.

As illustrated in FIGS. 4A-4D, the storage device transporter 800 includes a transporter body 810 having first and second portions 802, 804. The first portion 802 of the transporter body 810 includes a manipulation feature 812 (e.g., indention, protrusion, aperture, etc.) configured to receive or otherwise be engaged by the manipulator 210 for transporting. The second portion 804 of the transporter body 810 is configured to receive a storage device 500. In some examples, the second transporter body portion 804 defines a substantially U-shaped opening 820 formed by first and second sidewalls 822, 824 and a base plate 826 of the transporter body 810. The storage device 500 is received in the U-shaped opening 820 and supported by at least the base plate 826. FIGS. 4C-4D illustrate an exemplary storage device 500 that includes a housing 510 having top, bottom, front, rear, left and right surfaces 512, 514, 516, 518, 520, 522. The U-shaped opening 820 allows air moving through the test sot 330 to flow over the bottom surface 514 of the storage device 500. The storage device 500 is typically received with its rear surface 518 substantially facing the first portion 802 of the storage device transporter body 810. The first portion 802 of the transporter body 810 includes an air director 830 that receives and directs air substantially simultaneously (e.g., in parallel) over at least the top and bottom surfaces 512, 514 of the storage device 500 received in the storage device transporter 800. The air director 830 defines at least one air entrance 832 (e.g., aperture, slot, etc.) for receiving air into the first portion 802 of the transporter body 810 and directing it out into the second portion 804 of the transporter body 800, such that the air can move over at least the top and bottom surfaces 512, 514 of the received storage device 500. In some implementations, the air director 830 includes a guide (e.g., diverter, fin, plenum, etc.) for guiding the air over the received storage device 500. In some examples, the air director 830 is weighted to stabilize the storage device transporter 800 against vibration.

In some examples, the storage device transporter 800 includes a heater 860 that either provides conductive heating by direct contact with a received storage device 500 or convective heating by heating air flowing into and/or over the storage device transporter 800 and the received storage device 500. A detailed description of the heater 860 and other details and features combinable with those described herein may be found in the following U.S. patent application Ser. No. 12/503,593, filed on Jul. 15, 2009, the entire contents of which are hereby incorporated by reference.

Some storage devices 500 can be sensitive to vibrations. Fitting multiple storage devices 500 in a single test rack 330 and running the storage devices 500 (e.g., during testing), as well as the insertion and removal of the storage device transporters 800, each optionally carrying a storage device 500, from the various test slots 330 in the test rack 300 can be sources of undesirable vibration. In some cases, for example, one of the storage devices 500 may be operating under test within one of the test slots 330, while others are being removed and inserted into adjacent test slots 330 in the same rack 300. Clamping the storage device transporter 800 to the test slot 330 after the storage device transporter 800 is fully inserted into the test slot 330 can help to reduce or limit vibrations by limiting the contact and scraping between the storage device transporters 800 and the test slots 330 during insertion and removal of the storage device transporters 800.

In some implementations, the manipulator 210 is configured to initiate actuation of a clamping mechanism 840 disposed in the storage device transporter 800. This allows actuation of the clamping mechanism 840 before the storage device transporter 800 is moved to and from the test slot 330 to inhibit movement of the storage device 500 relative to the storage device transporter 800 during the move. Prior to insertion in the test slot 330, the manipulator 210 can again actuate the clamping mechanism 840 to release the storage device 500 within the transporter body 800. This allows for insertion of the storage device transporter 800 into one of the test slots 330, until the storage device 500 is in a test position engaged with the test slot 330 (e.g., a storage device connector 532 (e.g., electrical connector) of the storage device 500 (FIG. 6C) is engaged with a test slot connector 392 (FIG. 6C) (e.g., electrical connector) of the test slot 330). The clamping mechanism 840 may also be configured to engage the test slot 330, once received therein, to inhibit movement of the storage device transporter 800 relative to the test slot 330. In such implementations, once the storage device 500 is in the test position, the clamping mechanism 840 is engaged again (e.g., by the manipulator 210) to inhibit movement of the storage device transporter 800 relative to the test slot 330. The clamping of the storage device transporter 800 in this manner can help to reduce vibrations during testing. In some examples, after insertion, the storage device transporter 800 and storage device 500 carried therein are both clamped or secured in combination or individually within the test slot 330. A detailed description of the storage device transporter 800 and other details and features combinable with those described herein may be found in U.S. patent application Ser. No. 12/503,687, filed on Jul. 15, 2009, and in U.S. patent application Ser. No. 12/503,567, filed on Jul. 15, 2009. These applications are hereby incorporated by reference in their entireties.

Figure 5A:
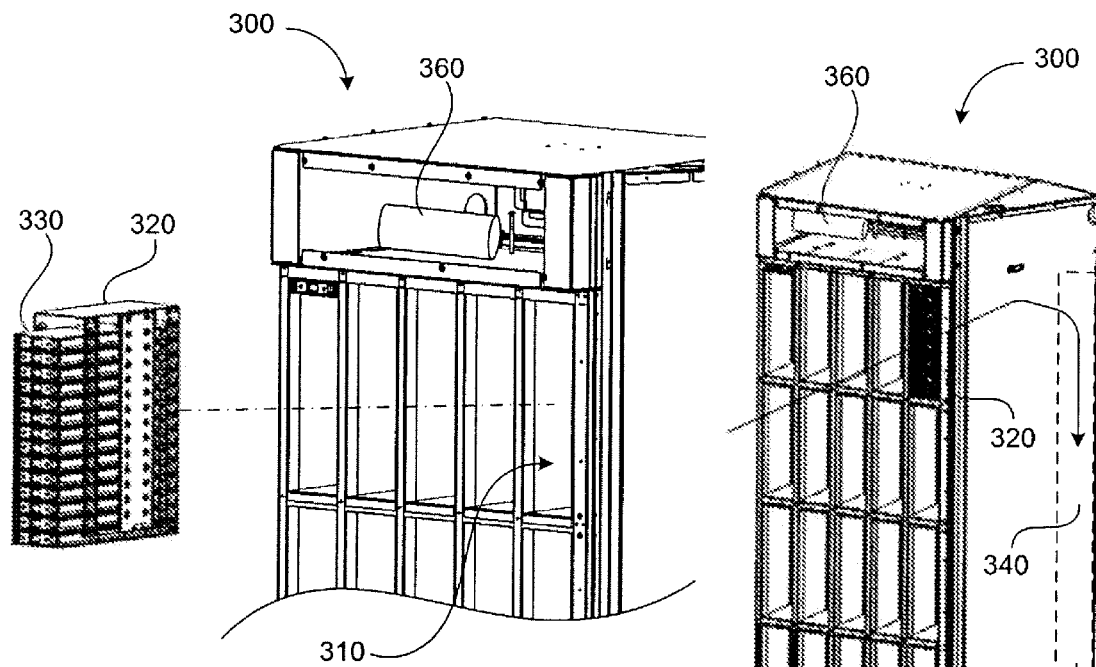
FIGS. 5A and 5B are perspective views of a rack receiving a test slot carrier holding test slots.
Figure 5B:
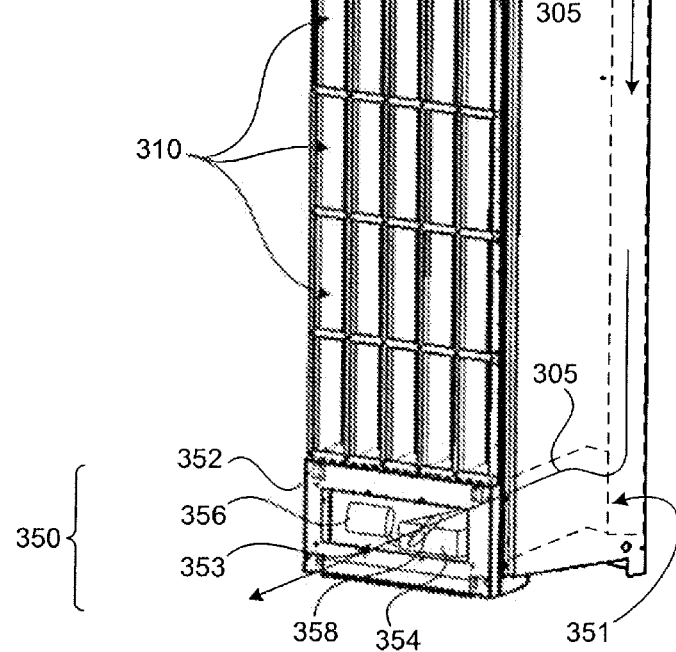

In the examples illustrated in FIGS. 5A and 5B, each rack 300 includes one or more carrier receptacles 310 each configured to receive a test slot carrier 320 that carries one or more test slots 330. The test slot carrier 320 provides a collection of test slots 330 that allows for bulk loading of test slots 330 into a rack 300. The rack 300 can be quickly serviced to change out different types of test slots 330 by removing one test slot carrier 320 having one type of test slots 330 from its respective carrier receptacle 310 and loading another carrier 320 having a different type or assortment of test slots 330 without having to modify the rack 300 to accommodate a particular mounting spacing for each type of test slot 330. Some carrier receptacles 310 may have a common standard size for receiving complementary standard sized test slot carriers 320. The number of test slot receptacles 324 any particular test slot carrier 320 carries may vary depending upon the type(s) of test slots 330 received therein. For example, a test slot carrier 320 will accommodate fewer relatively larger test slots 330 four receiving relatively larger storage devices 500 as compared to relatively smaller (thinner) test slots 300 for relatively smaller storage devices 500.

Each rack 300 includes an air conduit 340 (also shown in FIGS. 9A and 9B) that provides pneumatic communication between each test slot 330 of the respective rack 300 and an exit 353 of the rack 300. In some implementations, the air conduit 340 is formed by a space between the test slots 330 and a rear wall 303 of the rack 300. The air conduit 340 can also be attached to an exterior of the rack 300, such as the wedge shaped conduit 340 shown in FIG. 5B. In some implementations, as shown in FIG. 3, the air conduit 340 is in pneumatic communication with a system air mover 190 (e.g., via a common system air conduit 345) and/or air exterior to the rack 300, for moving air between the rack 300 and the environment around the rack 300. In this case, the system air mover 190 can be pneumatically connected to every air conduit 340 in the storage device testing system 100 (e.g., via the common system air conduit 345, which may include a bottom portion of the racks 300 below the test slots 330) to move air through each of the air conduits. The system air mover 190 moves air exterior of the racks 300 through the test slots 330 into the air conduits 340 and back out of the racks 300.

In the example shown in FIG. 5B, the air conduit 340 (also shown in FIGS. 9A and 9B) provides pneumatic communication between each test slot 330 of the respective rack 300 and an air heat exchanger 350. The air heat exchanger 350 is disposed below the carrier receptacles 310 remote to received test slots 330. The air heat exchanger 350 includes an air heat exchanger housing 352 defining an entrance 351, an exit 353, and an air flow path 305 therebetween. In some implementations, cooling elements 354 are disposed in the housing 352 in the air flow path 305 and a pump 356 delivers condensation accumulated from the air heat exchanger 350 to an evaporator 360, which may be disposed on the respective rack 300 of the air heat exchanger 350 (e.g., above the carrier receptacles 310), or to a drain. The air heat exchanger 350 may include an air mover 358 that pulls the air from the air conduit 340 into the entrance 351 of the air heat exchanger housing 352 over the cooling elements 354, if implemented, and moves the air out of the air heat exchanger housing exit 353 and out of the rack 300.

Figure 6A:
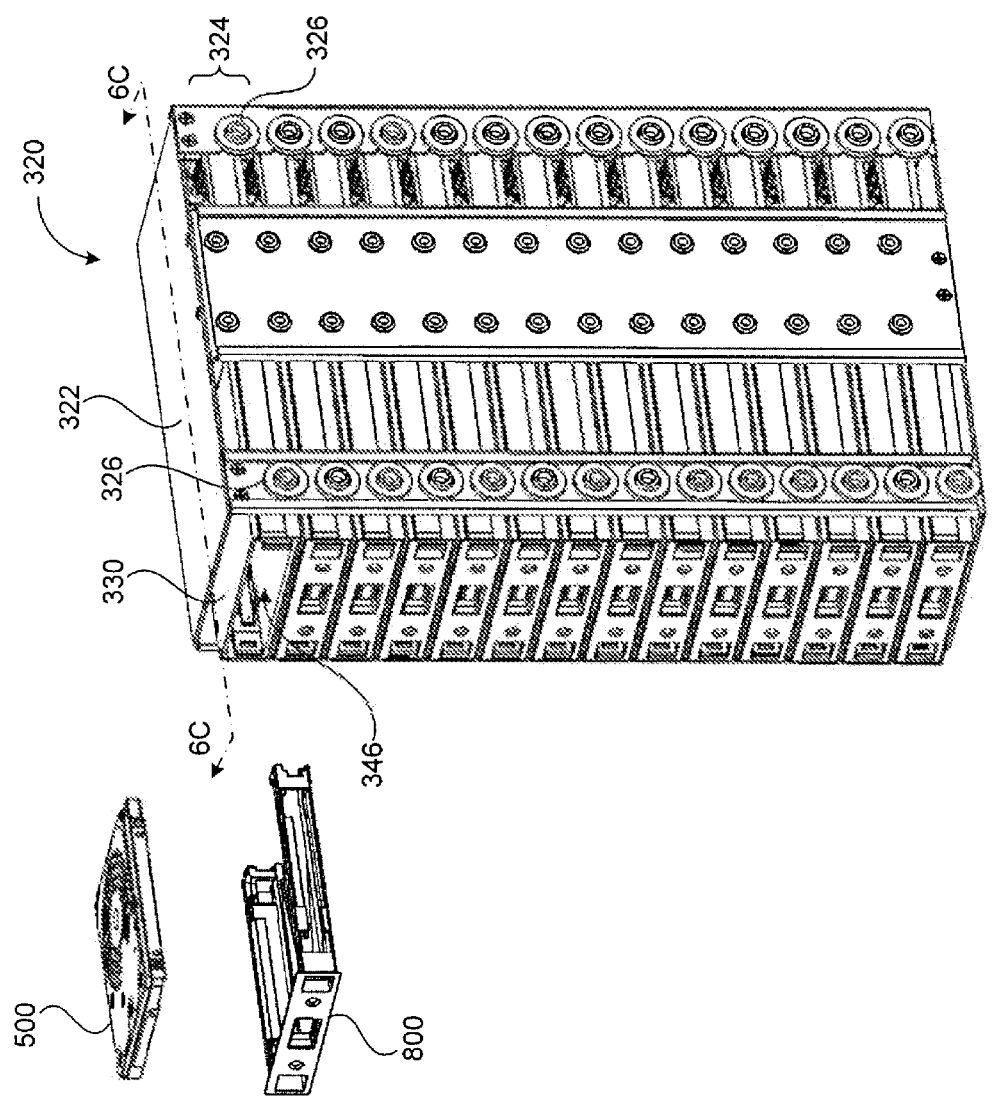
FIG. 6A is a perspective views of a test slot carrier holding test slots, one of which is receiving a storage device transporter carrying a storage device.
Figure 6B:
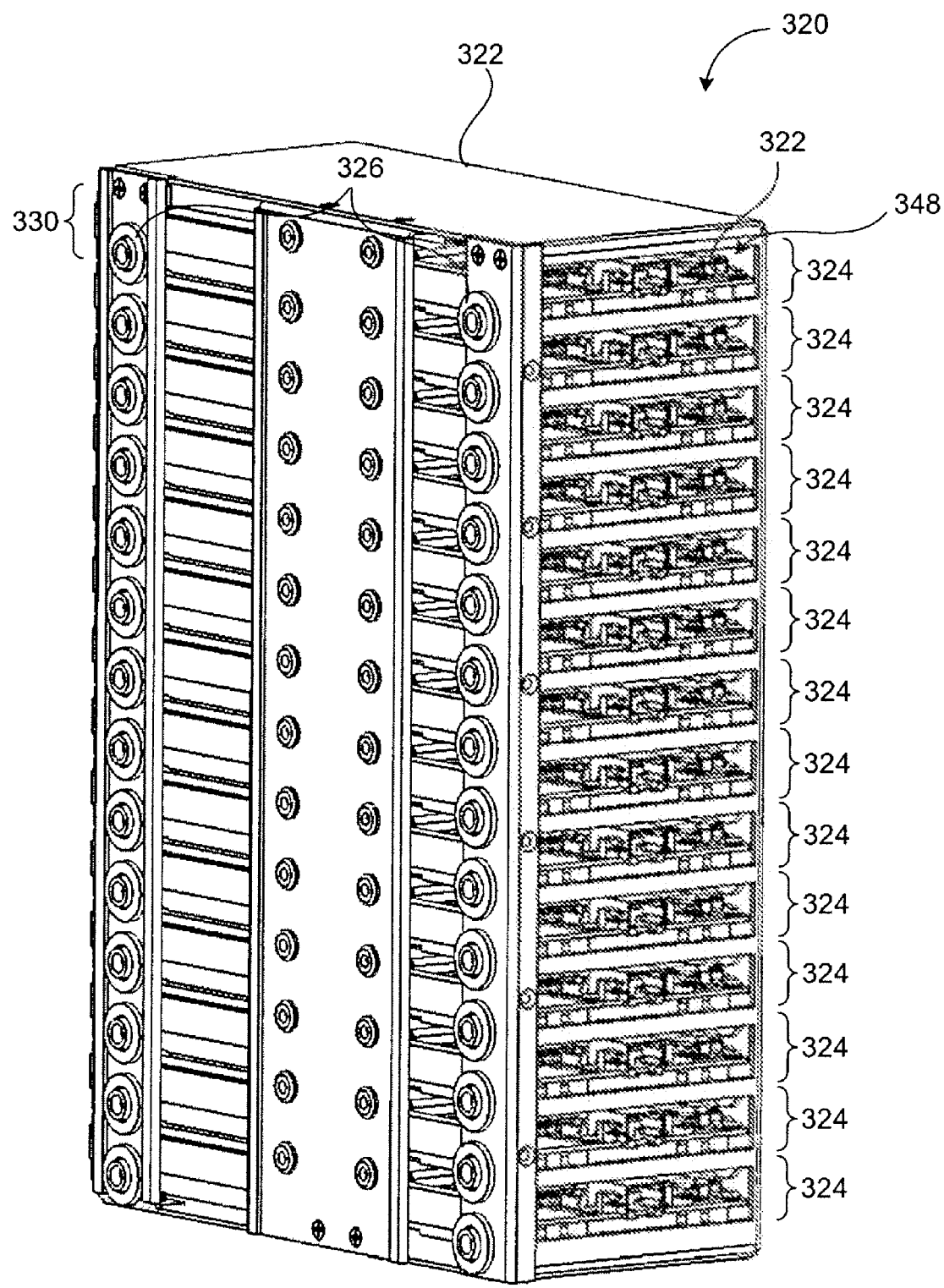
FIG. 6B is a rear perspective views of the test slot carrier of FIG. 6A.
Figure 6C:
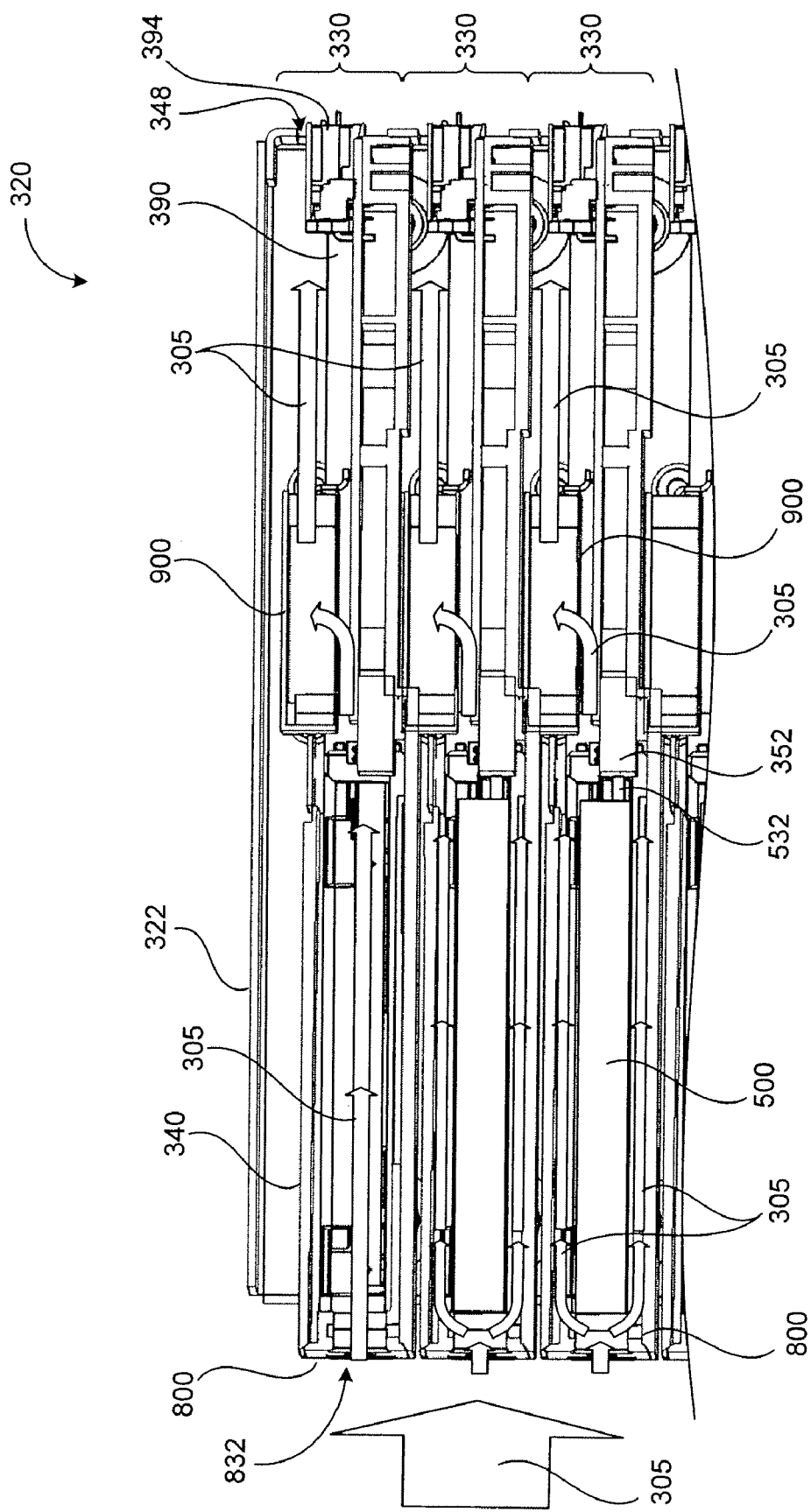
FIG. 6C is a sectional view of a test slot carrier along line 6C-6C in FIG. 6A.
Figure 7C:
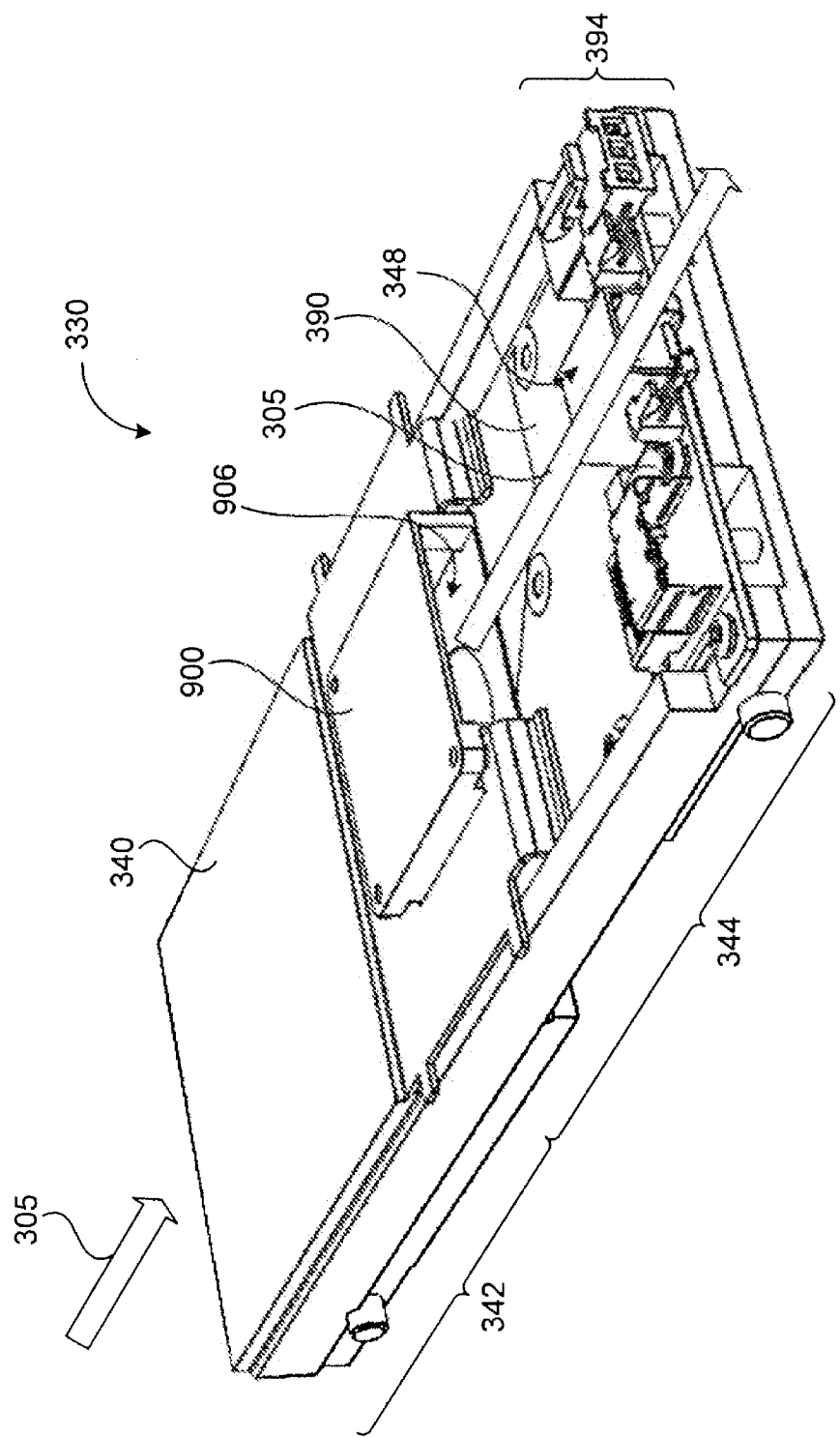
FIG. 7C is a rear perspective view of a test slot.

Referring to FIGS. 6A-6C, each test slot carrier 320 includes a body 322 having test slot receptacles 324 that are each configured to receive a test slot 330. Each test slot 330 is configured to receive a storage device transporter 800, which is configured to receive the storage device 500 and be handled by the manipulator 210 of the robotic arm 200. In use, one of the storage device transporters 800 is removed from or delivered to one of the test slots 330 by the robotic arm 200. Each test slot receptacle 324 may include one or more isolators 326 (e.g., rubber grommet) to dampen or isolate vibrations between the carrier body 322 and a received storage device 500. A detailed description of the test slot carrier 320 and other details and features combinable with those described herein may be found in the following U.S. patent application Ser. No. 12/698,605, filed on Feb. 2, 2010, the entire contents of which are hereby incorporated by reference.

Referring to FIGS. 6C and 7A-7C, each test slot 330 includes a test slot housing 340 for receipt by the rack 300 or a test slot receptacle 324 of a test slot carrier 320. The test slot housing 340 has first and second portions 342, 344. The first portion 342 of the test slot housing 340 defines a device opening 346 sized to receive a storage device 500 and/or a storage device transporter 800 carrying the storage device 500. The second portion 344 of the test slot housing 340 includes an air exit 348, electronics 390 (e.g., circuit board (s)), and an optional air mover 900. The electronics 390 are in communication with a test slot connector 392, which is configured to receive and establish electrical communication with a storage device connector 532 of the storage device 500. The electronics 390 also include a slot-rack connector 394 for establishing electrical communication with the rack 300. Air moved through the test slot 300 can be directed over the electronics 390.

Figure 8:
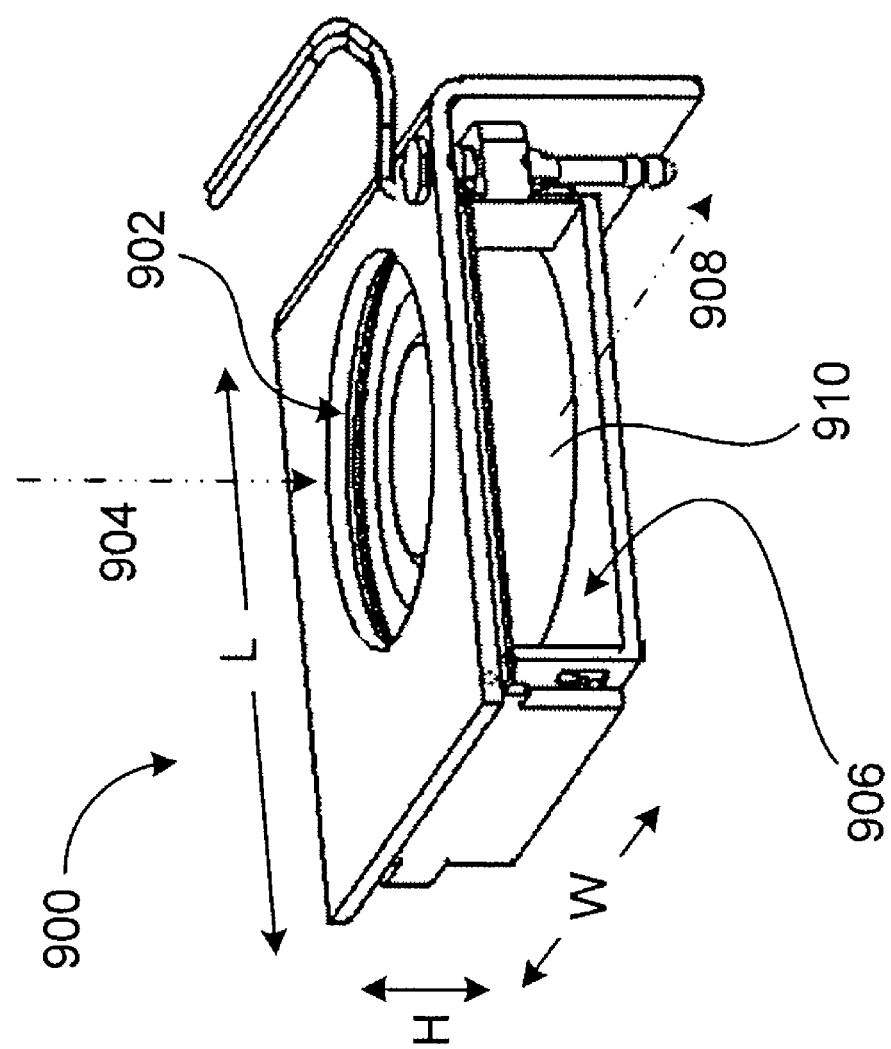
FIG. 8 is a perspective view of an air mover.

FIG. 8 illustrates an exemplary air mover 900 which has an air entrance 902 that receives air along a first direction 904 and an air exit 906 that delivers air along a second direction 908 substantially perpendicular to the first direction. Changing the direction of air movement within the air mover 900 eliminates the efficiency loss of changing the air flow direction within a conduit, thereby increasing the cooling efficiency of the storage device testing system 100. In some implementations, the air mover 900 includes an impeller 910 rotating at about 7100 revolutions per minute (rpm) to produce an air flow rate of up to about 0.122 $m^3$/min (4.308 CFM) (at zero static pressure) and an air pressure of up to about 20.88 $mmH_2O$ (0.822 $inchH_2O$) (at zero air flow). In some instances, the air mover 900 is the largest component of a cooling system for a test slot 330. The substantially horizontal placement of the air mover 900 within the storage device testing system 100 allows for a relatively lower overall height of the test slot 330 (allowing greater test slot density in the rack 300 and/or test slot carrier 320).

Figure 9A:
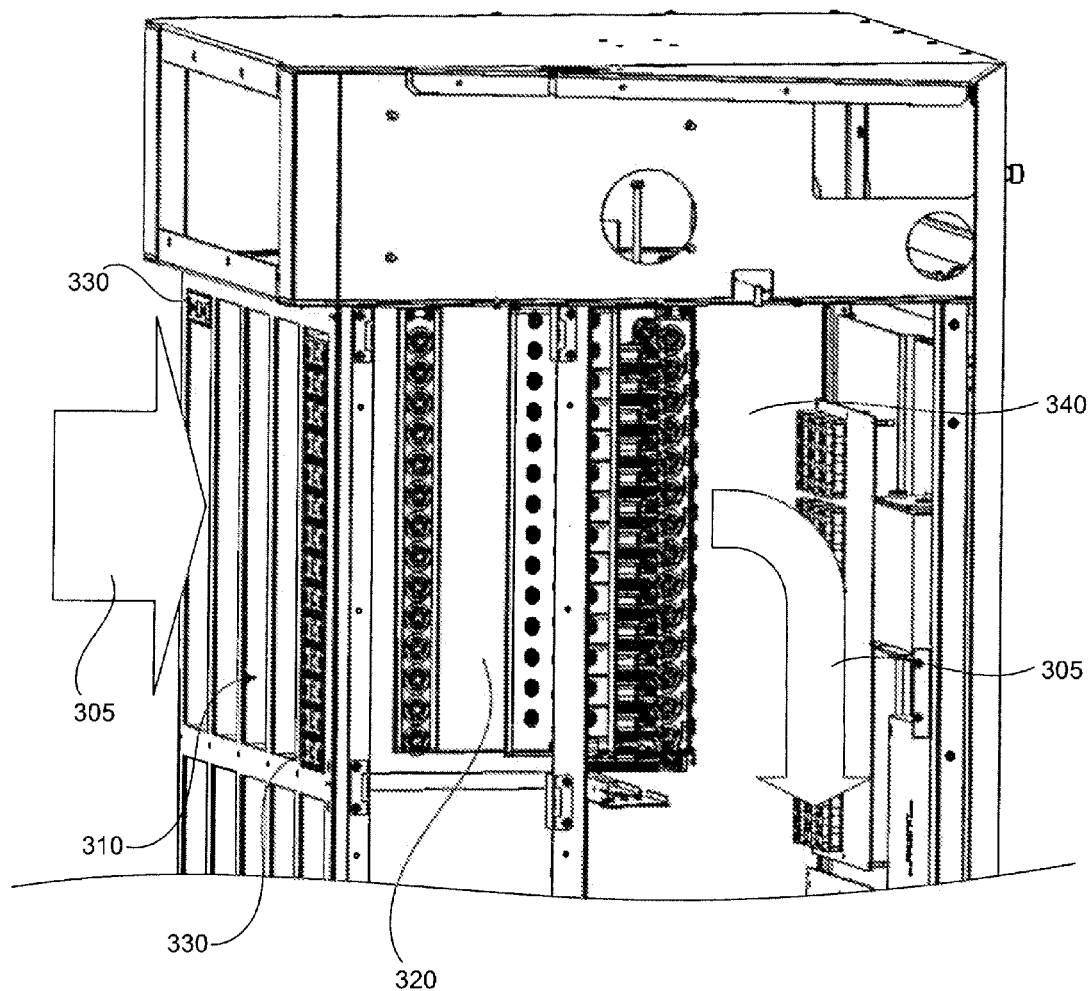
FIGS. 9A and 9B are perspective views of a rack of a storage device testing system showing an air flow path through the rack and test slots housed by the rack.
Figure 9B:
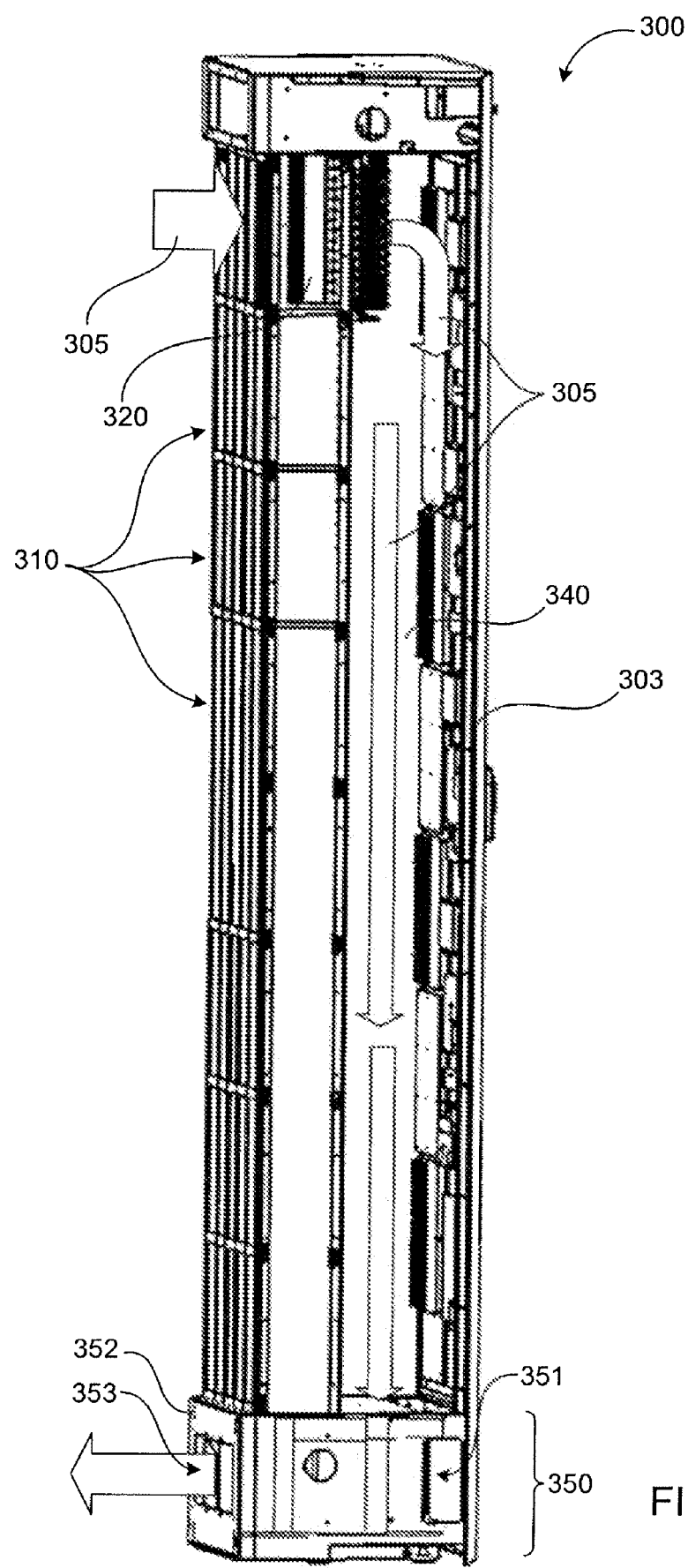

FIGS. 6C and 9A-9B illustrate a flow path 305 of air through test slots 330 and a rack 300 for regulating the temperature of a storage device 500 received in the storage device testing system 100. The air mover 900 of each test slot 330 housed in the rack 300 moves a flow of air from an exterior space of the rack 300 into at least one entrance 832 of the air director 830 of a storage device transporter 800 received in the test slot 330. The air flow is directed substantially simultaneously over at least top and bottom surfaces 512, 514 of the storage device 500 received in the storage device transporter 800. FIG. 6C provides a side sectional view of the test slot 330 and the air flow path 305 over the top and bottom surfaces 512, 514 of the received storage device 500. The air may also flow over other surfaces of the storage device 500 (e.g., front, back, left and right sides 516, 518, 520, 522). If no storage device 500 or storage device transporter 800 is received in the test slot 330, the air can flow directly through the first portion 342 of the test housing 340 to the air mover 900. The air mover 900 moves the air through the second portion 344 of the test slot housing 340 and out an air exit 348 (FIG. 6B) of the test slot 330 into the air conduit 340. The air moves through the air conduit 340 to the air heat exchanger 350 or the environment exterior to the rack 300. After passing through the air heat exchanger 350 the air is released back into the exterior space of the rack 300.

In some examples, the air mover 900 pulls the air into the air director 830 of storage device transporter 800, which directs the air flow 305 over at least the top and bottom surfaces 512, 514 of the storage device 500. The air mover 900 receives the flow of air from over the received storage device 500 along a first direction and delivers the air flow from the air mover 900 to the exit 348 of the test slot 330 along a second direction substantially perpendicular to the first direction.

In the examples shown, the storage device transporter 800 provides closure of the device opening 346 of the test slot housing 340 once received therein. As the air mover 900 moves the air to circulate along the air path 305, the air moves from the first portion 342 of the test slot housing 340 along a common direction to the second portion 344 of the test slot housing 340 while traversing the entire length of the received storage device 500. Since the air moves substantially concurrently along at least the top and bottom surfaces 512, 514 of the storage device 500, the air provides substantially even cooling of the storage device 500. If the air was routed along one side of the storage device first, such as the top surface 512, and then directed along another side sequentially second, such as the bottom surface 514, the air would become preheated after passing over the first side of the storage device 500 before passing over any additional sides of the storage device, thereby providing relatively less efficient cooling than flowing air over two or more sides of the storage device 500 substantially concurrently and/or without recirculation over the storage device 500 before passing through the air heat exchanger 350.

A method of performing storage device testing includes presenting one or more storage devices 500 to a storage device testing system 100 for testing at a source location (e.g., a loading/unloading station 600, storage device tote 700, test slot(s) 330, etc.) and actuating an automated transporter 200 (e.g. robotic arm) to retrieve one or more storage devices 500 from the source location and deliver the retrieved storage device(s) 500 to corresponding test slots 330 disposed on a rack 300 of the storage device testing system 100. The method includes actuating the automated transporter 200 to insert each retrieved storage device 500 in its respective test slot 330, and performing a test (e.g., functionality, power, connectivity, etc.) on the storage devices 500 received by the test slot 330. The method may also include actuating the automated transporter 200 to retrieve the tested storage device(s) 500 from the test slot(s) 330 and deliver the tested storage device(s) 500 to a destination location (e.g., another test slot 330, a storage device tote 700, a loading/unloading station 600, etc).

A method of regulating the temperature of a storage device 500 received in a storage device testing system 100 includes moving a flow of air into an air entrance 346 of a test slot housing 340 of a test slot 330 of a rack 300, moving the air flow over a storage device 500 received in the test slot 330, moving the air out an air exit 348 of the test slot housing 340 of the test slot 330, and releasing the air exteriorly of the rack 300. This method may be executed on a storage device testing system 100 to reduce the relative number of temperature control components generally required, while still allowing separate control of the temperature of each test slot 330. The method allows the storage device testing system 100 to have separate thermal control for each storage device test slot 330, with relatively fewer thermal control components, and without a separate closed loop air flow path for each test slot 330. In some examples, the method results in substantially no condensation forming in or near the test slot(s) 330, without having to manage the moisture content of the air.

In some implementations, the method includes using a common reservoir of cooled air, which may cooled by one or more air heat exchangers 350. Condensation formed on the air heat exchanger(s) 350 is concentrated in relatively few locations and may be removed by conventional methods, such as evaporators or drains. Alternatively, the heat exchanger(s) 350 may be controlled to operate above the dew point. Air from the common reservoir is drawn though each test slot 330 using a separate controllable air mover 900 for each test slot 330. The amount of cooling may be controlled by the speed of the air mover 900. To heat a storage device 500 received in a test slot 330, a heater 860 may be disposed so as to heat the received storage device 500 either directly or indirectly. For example, the heater 860 maybe placed in the inlet air path 346 to the test slot 330 and/or in direct contact with the received storage device. In some examples, the method includes allowing the received storage device 500 to self heat by reducing or shutting off the air flow through the test slot 300. In some implementations, the reservoir of cooled air is formed by the shape of the storage device testing system 100, rather than by a separate enclosure. The cooling air may also be used to cool other electronics disposed with in the storage device testing system 100.

In some examples, the air is moved to flow substantially simultaneously over at least the top and bottom surfaces 512, 514 of the storage device 500 received in the test slot 330. In some implementations, the method includes pulling air exterior of the rack 300 into a first portion 342 of the test slot housing 340 with an air mover 900 disposed in the test slot housing 340 and then moving the air through a second portion 344 of the test slot housing 340 over electronics 350 disposed in the second portion 344 and out an air exit 348 of the test slot housing 340. The method may include receiving the flow of air into the air mover 900 along a first direction 904 and moving the flow to the air exit 906 of the air mover 900 along a second direction 908 substantially perpendicular to the first direction 904. In some examples, the method includes delivering the air flow out of the air mover 900 at an air flow rate of up to about 0.122 m3/min (4.308 CFM) and an air pressure of up to about 20.88 mmH2O (0.822 inchH2O).

The method may include moving the air flow through an air director 830 of a storage device transporter 800 holding the storage device 500 and received in the test slot 330. The air director 830 defines one or more air entrances 832 that receive and direct the flow of air over at least the top and bottom surfaces 512, 514 of the storage device 500. The storage device transporter 800 includes a body 800 having first and second portions 802, 804. In some examples, the method includes receiving the storage device 500, which has top, bottom, front, rear, right, and left side surfaces 512, 514, 516, 518, 520, 522, in the storage device transporter 800 such that the rear surface 518 substantially faces the first body portion 802 of the storage device transporter body 800. The method may include weighting the air director 830 to reduce movement of the storage device transporter 800 while received by the storage device testing system 100.

In some implementations, the method includes moving the flow of air from the test slot 330 to an air heat exchanger 350 through an air conduit 340 that provides pneumatic communication therebetween. The air heat exchanger 350, in some examples, includes an air mover 358 that pulls the air from the air conduit 340 into the entrance 351 of the air heat exchanger housing 352 over the cooling elements 354 and moves the air out of the air heat exchanger housing exit 353 and out of the rack 300. The method may also include pumping condensation of the air heat exchanger 350 to an evaporator 360 disposed on the rack 300 or pumping to a drain, or allowing the condensate to drain through gravity.

A number of implementations have been described. Nevertheless, it will be understood that various modifications may be made without departing from the spirit and scope of the disclosure. For example, the air may flow in the opposite direction from that given in the exemplary embodiments. Air may also flow over only one side of the storage device, instead of over both the top and bottom surfaces. In systems with one air mover per test slot, the test slot air mover may be disposed in a number of locations, some not physically connected to the slot. Thermal control of the test slot may include means of heating the air by the addition of a heater in the inlet stream of the test slot. Accordingly, other implementations are within the scope of the following claims.

What is claimed is:

1. A storage device testing system comprising:
at least one rack;
an air heat exchanger configured for pneumatic communication with the at least one rack; and
one or more test slots housed by the at least one rack, a test slot comprising:
a test slot housing defining an entrance and an exit, the entrance configured to receive a storage device, and at least one of the entrance and the exit configured for pneumatic communication with the air heat exchanger; and
a test slot air mover configured for pneumatic communication with the test slot housing and further configured to move air exterior to the at least one rack into the entrance of the test slot housing, over the storage device received in the entrance of the test slot housing, through the air heat exchanger, out of the exit of the test slot housing, and out of the at least one rack;
wherein the test slot air mover is configured to move the air through the air heat exchanger at least one of before and after passing over the storage device received in the entrance of the test slot housing.

2. The storage device testing system of claim 1, wherein the at least one rack comprises an air conduit configured for pneumatic communication between the exit of the test slot housing and the air heat exchanger.

3. The storage device testing system of claim 1, wherein the entrance of the test slot housing is configured to receive a storage device transporter, the storage device transporter comprises a first portion and a second portion, the first portion of the storage device transporter comprises an air director, the second portion of the storage device transporter is configured to receive the storage device, and the air director is configured to direct the air substantially simultaneously over at least top and bottom surfaces of the storage device received in the storage device transporter.

4. The storage device testing system of claim 3, wherein the test slot air mover is further configured to move the air exterior to the at least one rack into the air director of the storage device transporter of the test slot, and
wherein the air director is configured to direct the air over the storage device received in the storage device transporter and out of the exit of the test slot housing.

5. The storage device testing system of claim 3, wherein the air director of the storage device transporter defines at least one air entrance, the storage device having top, bottom, front, rear, right, and left side surfaces, a front surface of the storage device having an electrical connector, the storage device being received by the storage device transporter with a rear surface of the storage device substantially facing the first portion of the storage device transporter, and wherein the at least one air entrance is configured to direct air over at least top and bottom surfaces of the storage device received in the entrance of the test slot housing.

* * * * *